US008327761B2

(12) United States Patent
Miyahara et al.

(10) Patent No.: US 8,327,761 B2
(45) Date of Patent: Dec. 11, 2012

(54) SCREEN PRINTER

(75) Inventors: Seiichi Miyahara, Yamanashi (JP);
Kazuhide Nagao, Yamanashi (JP);
Wataru Hidese, Fukuoka (JP); Yoshiaki Awata, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/267,372

(22) Filed: Oct. 6, 2011

(65) Prior Publication Data

US 2012/0085252 A1  Apr. 12, 2012

Related U.S. Application Data

(63) Continuation of application No. 12/935,976, filed as application No. PCT/JP2009/001502 on Mar. 31, 2009.

(30) Foreign Application Priority Data

Apr. 2, 2008 (JP) .................................. 2008-095614

(51) Int. Cl.
*B05C 17/06* (2006.01)
(52) U.S. Cl. ..................... 101/126; 101/114; 101/129
(58) Field of Classification Search .......... 101/114–118, 101/123, 126, 129, 479, 480
See application file for complete search history.

(56) References Cited

U.S. PATENT DOCUMENTS

| | | | |
|---|---|---|---|
| 6,202,551 B1 | 3/2001 | Murakami | |
| 6,267,819 B1 | 7/2001 | Doyle et al. | |
| 6,378,198 B1 * | 4/2002 | Asai et al. | 29/825 |
| 8,033,216 B2 * | 10/2011 | Chen | 101/114 |
| 8,196,287 B2 * | 6/2012 | Awata et al. | 29/740 |
| 2002/0007789 A1 | 1/2002 | Doyle et al. | |
| 2009/0314201 A1 * | 12/2009 | Baccini | 118/500 |

FOREIGN PATENT DOCUMENTS

| | | |
|---|---|---|
| JP | 59-97758 A | 6/1984 |
| JP | 04-129630 A | 4/1992 |
| JP | 08-032225 A | 2/1996 |
| JP | 2000-037847 A | 2/2000 |
| JP | 2000-168040 A | 6/2000 |
| JP | 2002-503161 A | 1/2002 |

(Continued)

OTHER PUBLICATIONS

International Search Report for Appl. No. PCT/JP2009/001502 dated May 12, 2009.

(Continued)

*Primary Examiner* — Ren Yan
(74) *Attorney, Agent, or Firm* — Pearne & Gordon LLP

(57) ABSTRACT

A screen printer capable of concurrently, efficiently subjecting a plurality of different types of substrates, to a printing operation. The screen printer makes up an electronic component mounting line and prints electronic component bonding paste on a substrate. A substrate conveyance section that conveys a substrate forwardly or backwardly in a direction of conveyance of a substrate is disposed at an intermediate position between a first screen printing section and a second screen printing section arranged symmetrically with respect to a center line CL. It thereby becomes possible to adopt a variety of substrate conveyance forms, as required, such as return conveyance for returning the substrate from a downstream machine to an upstream side of the screen printer and bypass conveyance for letting the substrate sent from an upstream side pass through the screen printer, to thus be conveyed to a downstream machine.

2 Claims, 16 Drawing Sheets

FOREIGN PATENT DOCUMENTS

| | | |
|---|---|---|
| JP | 2003-110299 A | 4/2003 |
| JP | 2003-163499 A | 6/2003 |
| JP | 2004-142299 A | 5/2004 |
| JP | 2005-081745 A | 3/2005 |
| WO | 2005-009100 A1 | 1/2005 |

OTHER PUBLICATIONS

Foreign Office Action for application No. GB1016612.2 dated Jul. 2, 2012.

* cited by examiner

SCREEN PRINTER

TECHNICAL FIELD

The present invention relates to a screen printer that makes up an electronic component mounting line, which manufactures a mounted substrate by mounting electronic components on a substrate and that prints solder bonding paste on the substrate.

BACKGROUND ART

An electronic component mounting line through which a mounted substrate is manufactured by mounting electronic components on a substrate is constructed by coupling together screen printers that print solder bonding paste on electronic components, electronic component loaders for loading the electronic components on a printed substrate, and the like. Producing multiple products in small quantities has recently become a predominant production style in the electronic industry, too. Therefore, a production facility has also become required to have a facility configuration that exhibits both the ability to achieve high production efficiency and flexibility to adapt to a variety of production styles.

In order to realize such a production facility, various characteristic mechanisms and configurations have hitherto been brought into a layout of an electronic component mounting line and machines constituting the electronic component mounting line. For instance, a configuration including a plurality of independently movable substrate transport conveyors (see Patent Document 1) is used for the purpose of enhancing transport efficiency of substrates and simultaneous transport of a plurality of substrates. Simultaneous production of a plurality of substrate thereby becomes possible, to thus achieve superior production efficiency. Further, a facility that has the superior capability of addressing production of multiple products and that enables simultaneous production of a plurality of types of substrates can be implemented.

In order to simultaneously produce a plurality of substrates, a screen printer's throughput capacity to feed solder bonding paste to a substrate must be increased so as to meet the number of substrates to be produced. For this reason, there have been employed various mechanisms, such as a configuration for arranging a plurality of screen printers in series along an electronic component mounting line, to thus increase overall throughput capacity (see Patent Document 2), a method for increasing the number of substrates to be processed by simultaneously printing two substrates by means of a single mask plate (see Patent Document 3), and a method for increasing the number of substrates to be processed by arranging independent screen printing mechanisms in series within a single system.

Patent Document 1: JP-A-4-129630
Patent Document 2: JP-A-2004-142299
Patent Document 3: JP-A-2000-37847
Patent Document 4: JP-A-2000-168040

DISCLOSURE OF THE INVENTION

Problem that the Invention is to Solve

However, the example related-art technologies described in connection with Patent Documents 2 and 3 suffer problems, such as those provided below. Specifically, all of the example technologies described in connection with Patent Documents 2 and 3 adopt a configuration for conveying a substrate by means of a single substrate conveyance path. Therefore, a substrate conveyance sequence along which a printed substrate is delivered to a downstream electronic component loader is fixed, and difficulty is encountered in supplying a substrate required for the downstream machine at required timing. For this reason, it has been difficult to apply the configurations described in connection with the example related-art technologies to mixed-flow production involving simultaneous flow of different types of substrates.

A two-sided mount style for mounting electronic components on both sides of a substrate has recently become common practice on account of an increase in packing density. For this reason, there is needed substrate conveyance operation for returning the substrate, one side of which has finished undergoing mounting operation, to an upstream position with respect to the screen printer. However, in a related-art screen printer, such an operation for conveying a substrate is manually performed by a worker in many cases. Implementing laborsaving by full automatization of substrate conveyance operation has been longed. As mentioned above, the screen printers employed in the related-art electronic component mounting line suffer a problem of the difficulty of concurrently, efficiently subjecting a plurality of substrates, including different types of substrates, to printing operation.

The present invention aims at providing a screen printer capable of concurrently, efficiently performing printing operation on a plurality of substrates including different types of substrates.

Means for Solving the Problem

The present invention provides a screen printer that is coupled to an upstream side of an electronic component loader which mounts electronic components on a substrate, to thus make up an electronic component mounting line, and that prints electronic component bonding paste to the substrate, the printer comprising: two screen printing sections that each have a mask plate including a pattern hole and a squeegee moving mechanism which lets a squeegee slidably move over the mask plate supplied with paste and that are arranged symmetrically with respect to a center line of the electronic component mounting line when viewed in plane; a substrate positioning section that is provided in each of the two screen printing sections and that positions and holds the substrate at a print position for the screen printing section of interest; and a substrate conveyance section that is disposed between the two screen printing sections and that conveys the substrate in a direction of conveyance of a substrate.

Advantage of the Invention

In the screen printer of the present invention, the substrate conveyance section that conveys the substrate in the direction of conveyance of a substrate is disposed at an intermediate position between two screen printing sections that are arranged symmetrically with respect to a center line. It thereby becomes possible to adopt a variety of substrate conveyance forms, as required, such as return conveyance for returning the substrate from a downstream machine to an upstream side of the screen printer and bypass conveyance for letting the substrate sent from the upstream side pass through the screen printer, to thus be conveyed to a downstream machine. The plurality of substrates, including different types of substrates, can concurrently, efficiently undergo printing operation.

DESCRIPTIONS OF THE REFERENCE NUMERALS AND SYMBOLS

1, 1A, 1B ELECTRONIC COMPONENT MOUNTING LINE
2, 2A PRINTER (SCREEN PRINTER)
3, 3A, 3B LOADER (ELECTRONIC COMPONENT LOADER)
4, 4A SUBSTRATE SORTER
5, 5A, 5B, 5C, 5D SUBSTRATE
7A FIRST SCREEN PRINTING SECTION
7B SECOND SCREEN PRINTING SECTION
8, 8A SUBSTRATE CONVEYANCE SECTION
8*b* SUBSTRATE CONVEYANCE RAIL
12A, 12B, 12C SUBSTRATE CONVEYANCE RAIL
21 SUBSTRATE POSITIONING SECTION
32 MASK PLATE
33 SQUEEGEE UNIT
36 SQUEEGEE
L1, L2, L3, L4 SUBSTRATE CONVEYANCE LANE

BEST MODES FOR IMPLEMENTING THE INVENTION

Embodiments of the present invention are described hereunder by reference to the drawings.

(First Embodiment)

Figure 1:
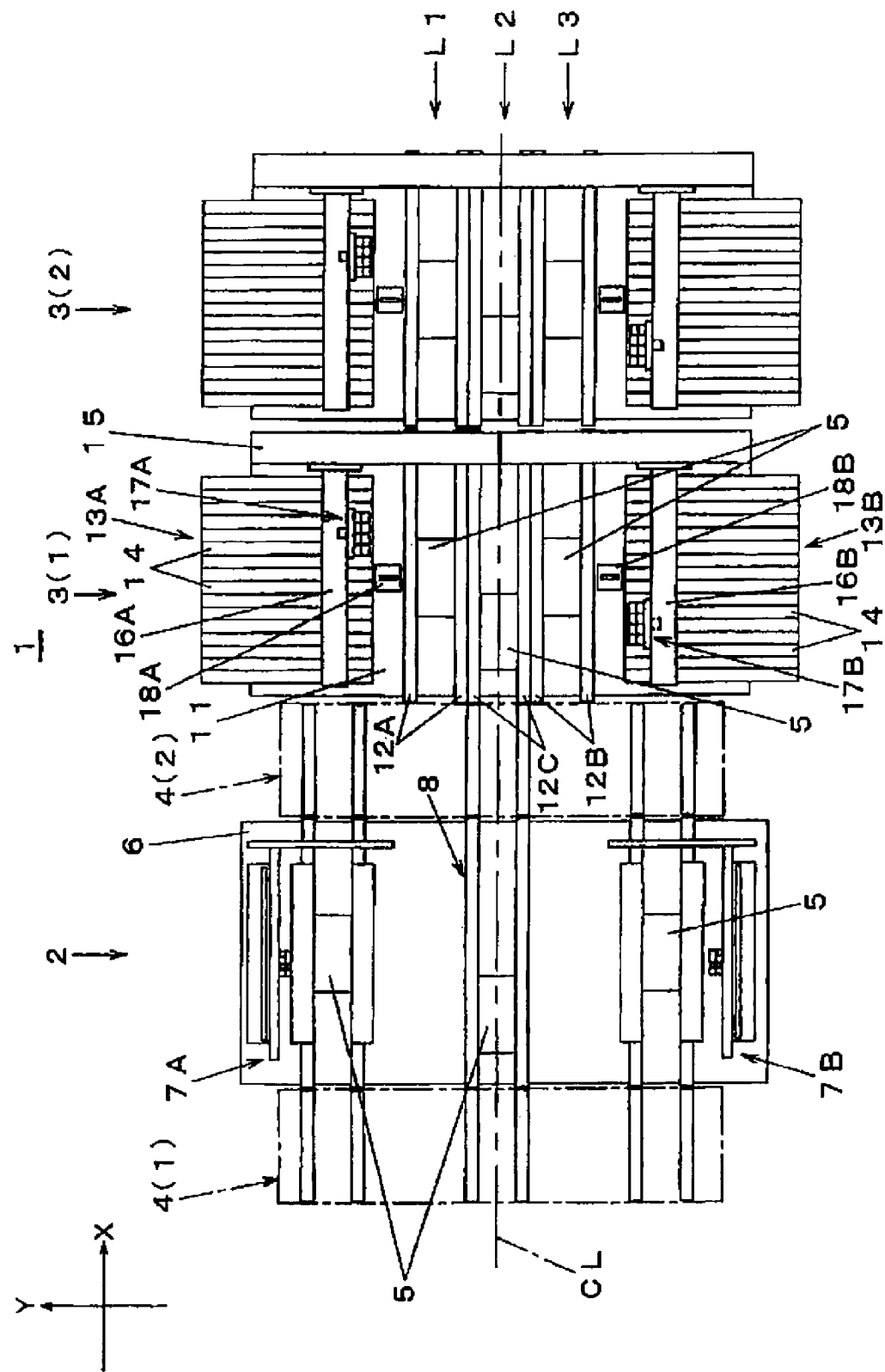
FIG. 1 is a plan view showing a configuration of an electronic component mounting line of a first embodiment of the present invention.
Figure 2:
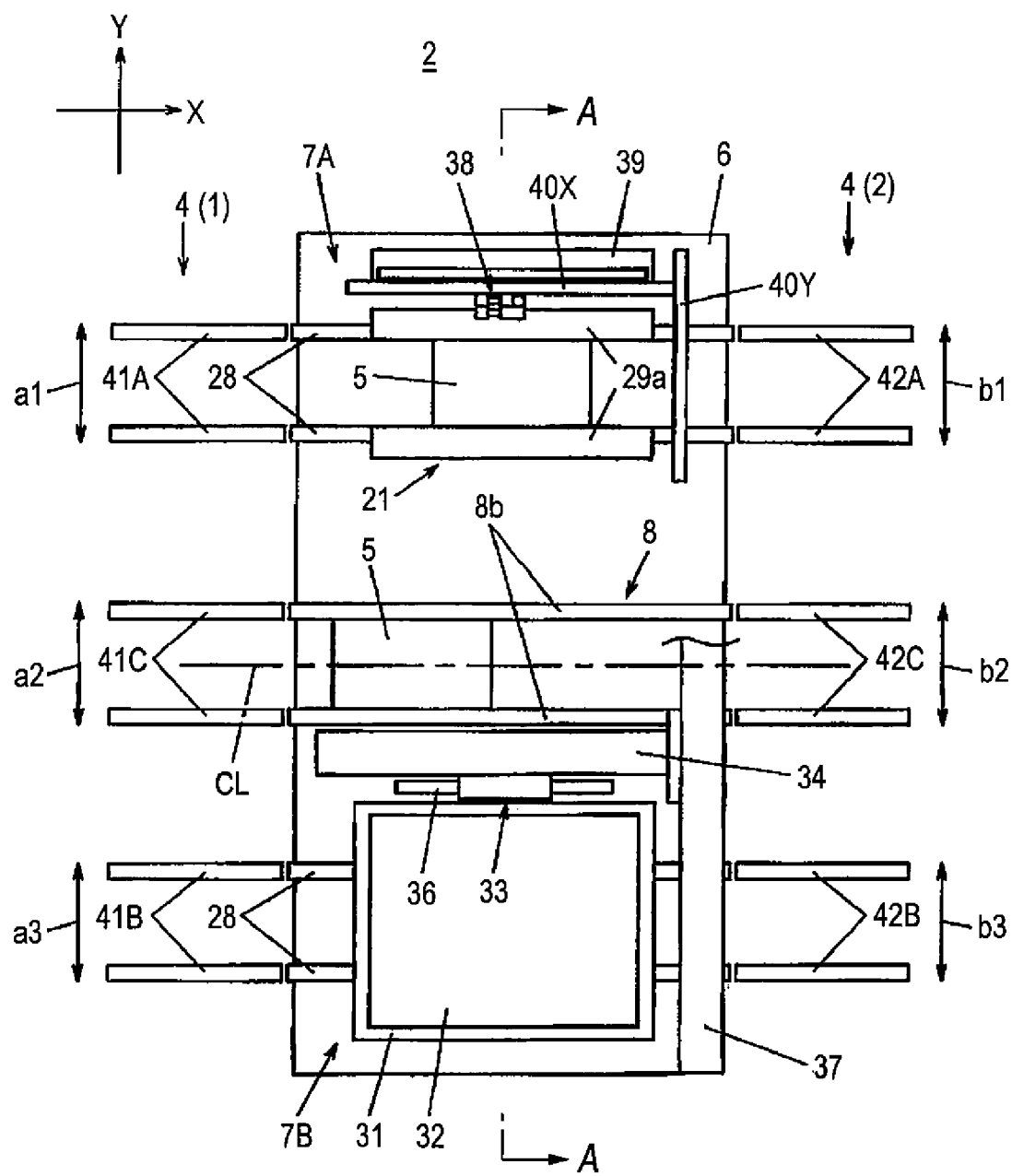
FIG. 2 is a plan view showing a screen printer of the first embodiment of the present invention.
Figure 3:
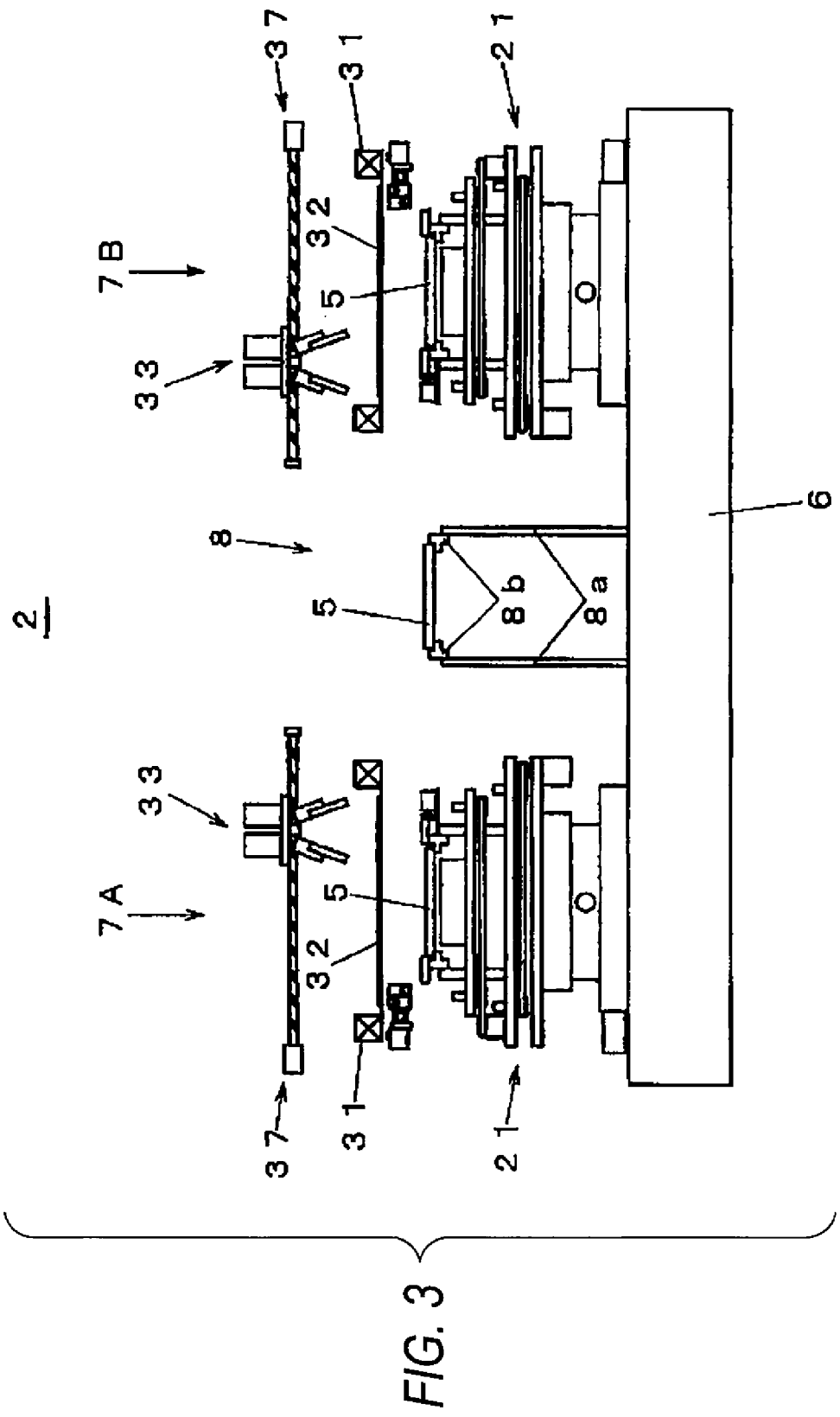
FIG. 3 is a cross-sectional view of the screen printer of the first embodiment of the present invention.
Figure 4:
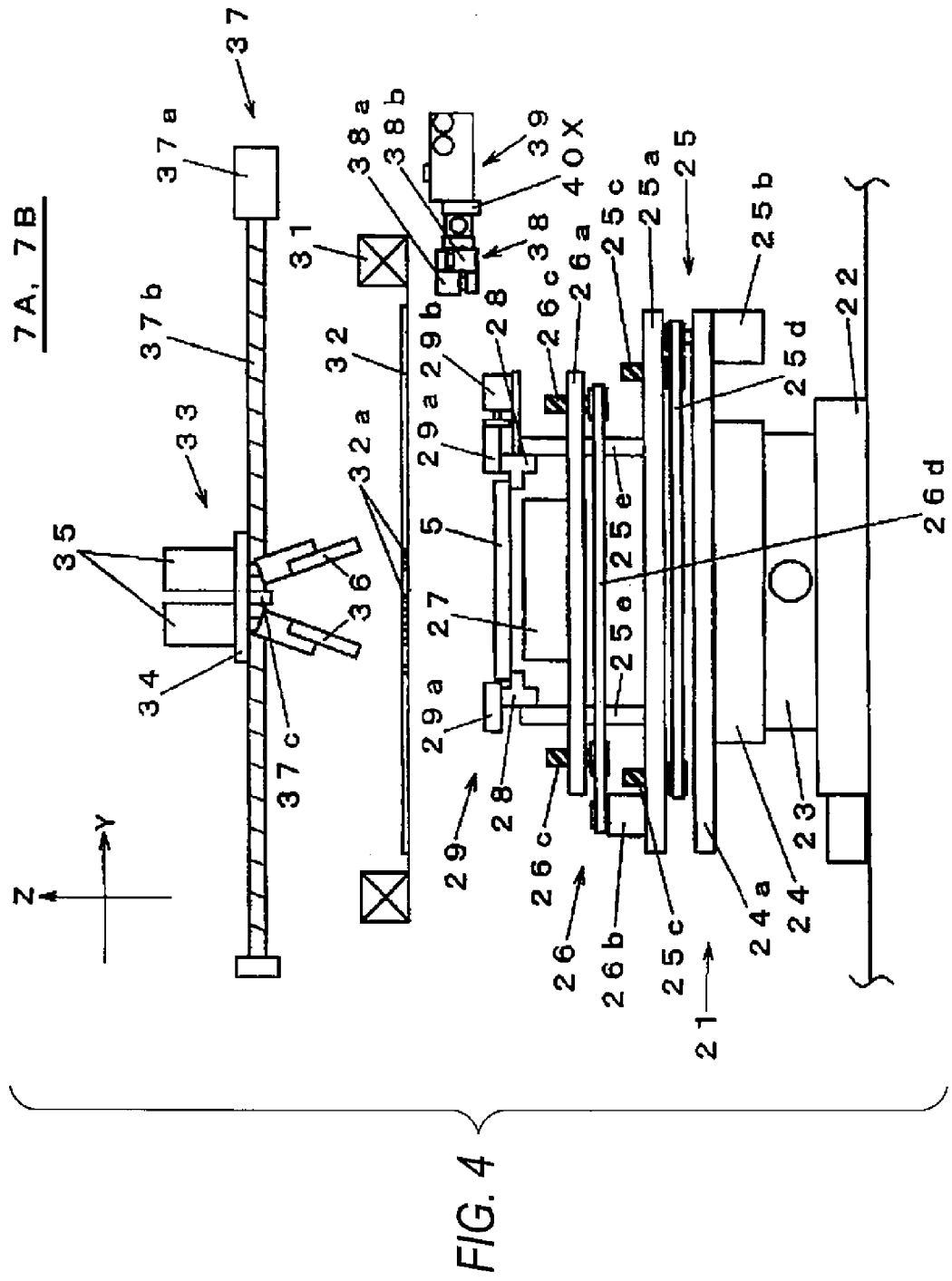
FIG. 4 is a cross-sectional view of a screen printing section in the screen printer of the first embodiment of the present invention.
Figure 5:
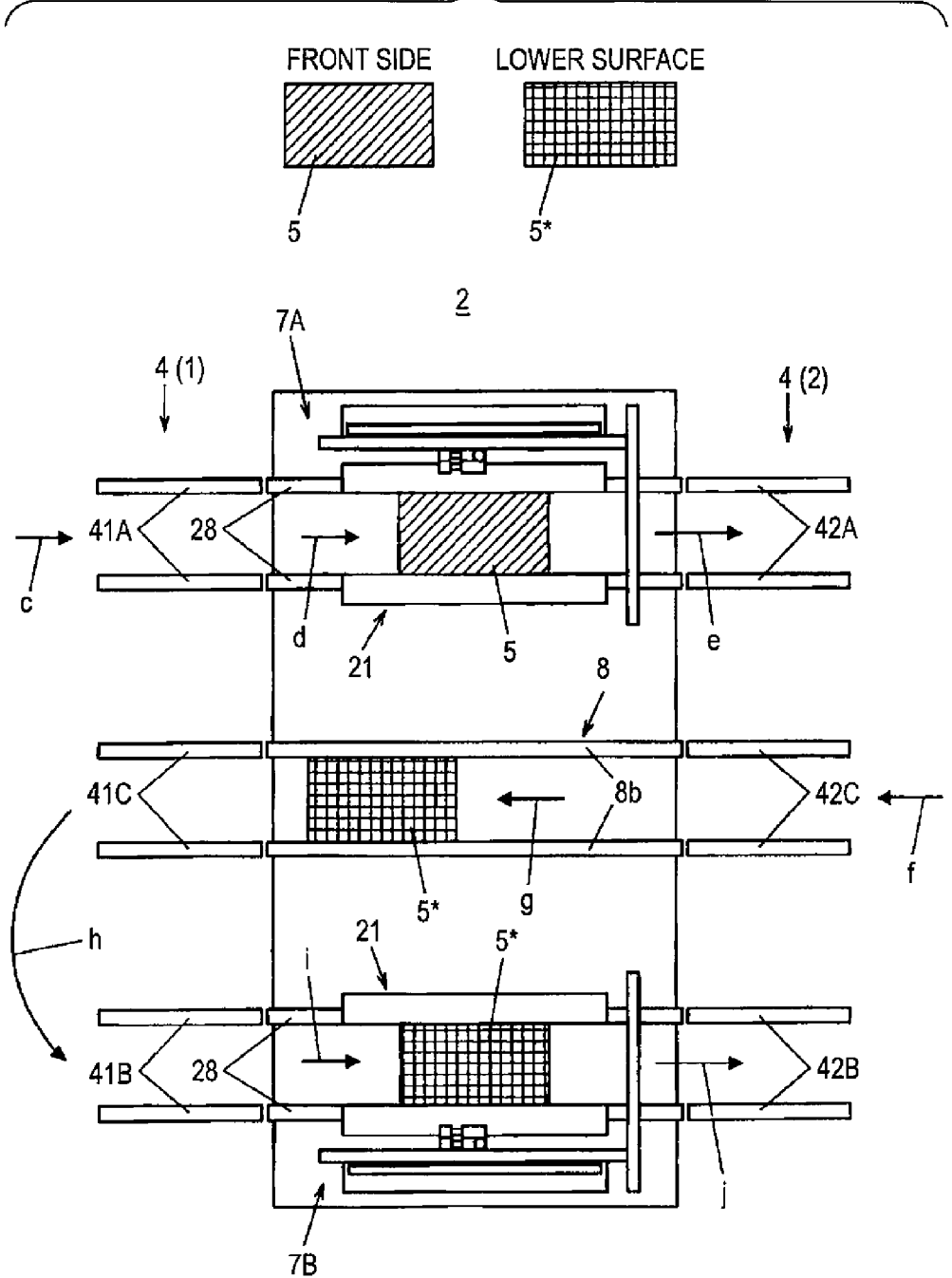
FIG. 5 is a descriptive operation diagram of substrate conveyance motion of the screen printer of the first embodiment of the present invention.
Figure 6:
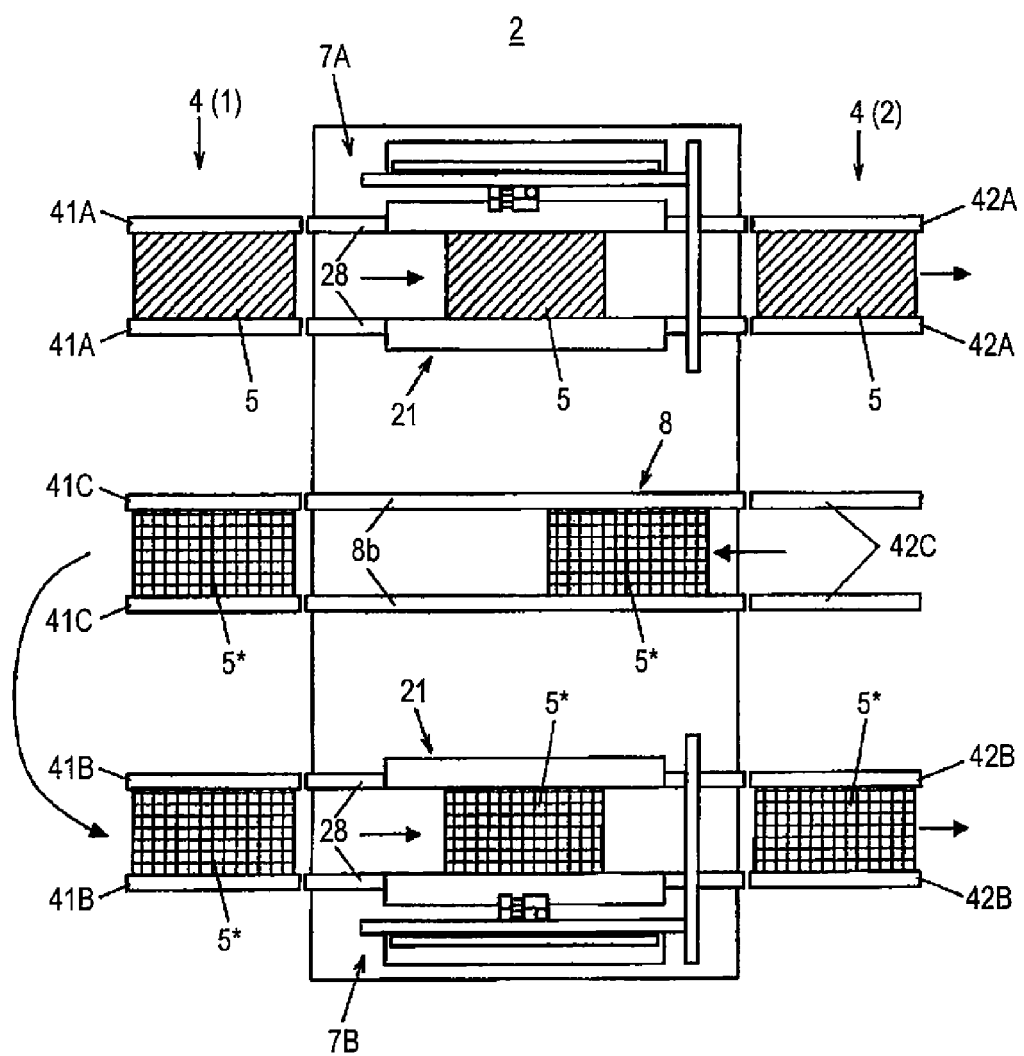
FIG. 6 is a descriptive operation diagram of substrate conveyance motion of the screen printer of the first embodiment of the present invention.

FIG. 1 is a plan view showing a configuration of an electronic component mounting line of a first embodiment of the present invention; FIG. 2 is a plan view showing a screen printer of the first embodiment of the present invention; FIG. 3 is a cross-sectional view of the screen printer of the first embodiment of the present invention; FIG. 4 is a cross-sectional view of a screen printing section in the screen printer of the first embodiment of the present invention; FIG. 5 is a descriptive operation diagram of substrate conveyance motion of the screen printer of the first embodiment of the present invention; and FIG. 6 is a descriptive operation diagram of substrate conveyance motion of the screen printer of the first embodiment of the present invention.

A configuration of an electronic component mounting line 1 is first described by reference to FIG. 1. The electronic component mounting line 1 has a function of manufacturing a mounted substrate by mounting electronic components on a substrate and is also configured such that a screen printer 2 (hereinafter abbreviated simply as a "printer 2") that prints electronic component bonding paste on a substrate is coupled to an upstream side (on a left-hand side in FIG. 1) of an electronic component loader 3 (hereinafter abbreviated simply as a "loader 3") that mounts electronic components on a substrate. In descriptions of the present specification, subscripts (1), (2), . . . assigned to respective machines, such as a printer and a loader, designate a sequence of arrangement of the machines in the electronic component mounting line from the upstream side.

In the present embodiment, two loaders 3(1) and 3(2) are coupled in series to a downstream side of one printer 2. A substrate sorter 4(1) is annexed to an upstream side of the printer 2, and a substrate sorter 4(2) is annexed to a downstream side of the printer 2. A substrate carried out of an upstream apparatus is brought into the printer 2 by way of the substrate sorter 4(1). The substrate that has undergone screen printing in the printer 2 is delivered to the loader 3(1) by way of the substrate sorter 4(2).

The printer 2 is made up of first and second screen printing sections 7A and 7B, each of which has a function of printing electronic component bonding paste on a substrate 5 which is to serve as an object of mounting operation, wherein the first and second screen printing sections are arranged on a common base 6 so as to become symmetrical about a line center CL of the electronic component line 1 when viewed in plane. A substrate conveyance section 8 that forwardly or backwardly conveys the substrate 5 in a substrate conveyance direction (a direction X) is disposed at an intermediate position between the first screen printing section 7A and the second screen printing section 7B.

A configuration of the loader 3 is now described. The loader 3(1) and the loader 3(2) are structurally identical with each other. Explanations are given solely to the loader 3(1) by assigning reference numerals to individual constituent elements. Three pairs of substrate conveyance rails 12A, 12B, and 12C are laid in parallel to each other at the center of a base 11 along a direction of conveyance of a substrate (the X direction). The substrate conveyance rails 12A, 12B, and 12C make up three rows of substrate conveyance lanes L1, L2, and L3 that convey the substrate 5 passed from the printer 2 by way of the substrate sorter 4(2), respectively. In the present embodiment, each of only the substrate conveyance lanes L1 and L3, among the three rows of substrate conveyance lanes L1, L2, and L3, is provided with a mount stage for positioning the substrate 5 at a mounting position and performing mounting operation. The substrate conveyance lane L2 located at the center is designed so as to act as a return conveyance path for conveying the substrate 5 from the downstream side to the upstream side.

A component feeding section 13A is disposed on the outside of the substrate conveyance rail 12A, and a component feeding section 13B is disposed on the outside of the substrate conveyance rail 12B. A plurality of tape feeders 14 are arranged side by side in each of the component feeding sections 13A and 13B. The tape feeder 14 performs pitch feed of a carrier tape holding electronic components to be mounted on the substrate 5, thereby supplying an electronic component to a component pickup position by means of a component loading mechanism to be described below. A Y-axis moving table 15 is disposed on an X-direction end of the base 11. Two X-axis moving tables 16A and 16B coupled to the Y-axis moving table 15 are equipped with loading heads 17A and 17B, respectively. Each of the loading heads 17A and 17B is equipped with a plurality of unit loading heads, and an electronic component is held by a suction nozzle provided on the individual unit loading head by means of vacuum suction.

The loading heads 17A and 17B are horizontally moved in both the X direction and the Y direction, by driving the Y-axis moving table 15 and the X-axis moving tables 16A and 16B. The loading heads 17A and 17B pick up electronic components from the tape feeders 14 of the respective component feeding sections 13A and 13B by means of suction and transfer and mount the thus-picked-up electronic components to the substrates 5 positioned on the respective mount stages of the substrate conveyance rails 12A and 12B. Component recognition cameras 18A and 18B are placed at any positions along respective travel paths of the loading heads 17A and 17B. When the loading heads 17A and 17B holding the electronic components travel over the component recognition cameras 18A and 18B, whereby the component recognition cameras 18A and 18B capture, from below, images of the electronic components held by the loading heads 17A and 17B, thereby determining the electronic components through recognition.

By reference to FIGS. 2, 3, and 4, a structure of the printer 2 is now described. FIG. 3 shows a cross section of the printer when viewed in an arrowy direction A-A shown in FIG. 2, and FIG. 4 is a detailed cross sectional view for describing a structure of the first screen printing section 7A and a structure of the second screen printing section 7B. As indicated by the cross section shown in FIG. 3, the printer 2 has substrate positioning sections 21 that each are provided in the first screen printing section 7A and the second screen printing section 7B, which are arranged on the base 6 in a symmetrical pattern, for holding the substrates 5 at respective print positions. A mask plate 32 having pattern holes and a squeegee moving mechanism 37 that slidably moves a squeegee 36 (see FIG. 4) of a squeegee unit 33 over the mask plate 32 supplied with paste are arranged above the substrate positioning section 21. The mask plate 32, the squeegee unit 33, and the squeegee moving mechanism 37 make up a screen printing mechanism that prints paste on the substrate 5 of interest.

A detailed configuration of the substrate positioning section 21, a detailed configuration of the squeegee unit 33, and a detailed configuration of the squeegee moving mechanism 37 are described by reference to FIG. 4. In FIG. 4, the substrate positioning section 21 is built by stacking a Y-axis table 22, an X-axis table 23, and a O-axis table 24 into layers and by additional stacking of a first Z-axis table 25 and a second Z-axis table 26 on these tables in combination. A configuration of the first Z-axis table 25 is described. A horizontal base plate 24a is provided on an upper surface of the O-axis table 24, and a horizontal base plate 25a is likewise held on the upper surface side of the base plate 24a by an elevation guide mechanism (not shown) so as to freely ascend or descend. The base plate 25a is caused to ascend or descend by a Z-axis elevation mechanism constructed so as to rotationally drive a plurality of feed screws 25c by way of a belt 25d by means of a substrate moving Z-axis motor 25b. Two vertical frames 25e stand upright on the base plate 25a, and a pair of substrate conveyance rails 28 making up a substrate conveyance path are held on upper ends of the respective vertical frames 25e.

The substrate conveyance rails 28 are laid in parallel to the direction of conveyance of a substrate (the X direction; in other words, a direction perpendicular to a drawing sheet of FIG. 1). The substrate 5 that is an object of printing is conveyed while both ends of the substrate are supported by a conveyor mechanism provided on the substrate conveyance rails 28. The substrate 5 held by the substrate conveyance rails 28 can be caused to ascend or descend with respect to the screen printing mechanism in conjunction with the substrate conveyance rails 28 by driving the first Z-axis table 25.

A configuration of the second Z-axis table 26 is described. A horizontal base plate 26a is interposed between the conveyance rails 28 and the base plate 25a so as to be able to freely ascend or descend along the elevation guide mechanism (omitted from the drawings). The base plate 26a is caused to ascend or descend by means of the Z-axis elevation mechanism configured so as to rotationally drive a plurality of feed screws 26c by means of a lower support elevation motor 26b and by way of a belt 26d. A substrate support section 27 is removably attached to the upper surface of the base plate 26a. The substrate support section 27 supports from below the substrate 5 conveyed to the print position by means of the screen printing mechanism.

In printing operation of the first screen printing section 7A and the second screen printing section 7B, the substrate conveyance rails 28 receive the respective substrates 5 fed from an upstream machine by way of sorting conveyors 41A and 41B of the substrate sorter 4(1); convey the thus-received substrates to the respective print positions for the screen printing mechanisms; and hold the substrates at the positions. The substrate conveyance rails 28 carry the substrates 5, which have undergone printing in the screen printing mechanisms, out of the print positions and send the thus-carried substrates to sorting conveyors 42A and 42B of the substrate sorter 4(2).

The substrate support section 27 ascends or descends with respect to the substrate 5 held by the substrate conveyance rails 28 by actuation of the second Z-axis table 26. A lower support surface of the substrate support section 27 comes into contact with the lower surface of the substrate 5, whereby the substrate support section 27 supports the substrate 5 from its lower surface side. A clamp mechanism 29 is disposed on upper surfaces of the substrate conveyance rails 28. The clamp mechanism 29 has two clamp members 29a positioned side by side so as to oppose each other. A drive mechanism 29b lets one clamp member 29a move forward or backward, thereby clamping and fastening the substrate 5 from both sides thereof.

An explanation is now given to a structure of the screen print mechanism that is disposed above the substrate positioning section 21 and that prints paste on the substrate conveyed to the print position. In FIGS. 2 and 4, the mask plate 32 is extended over a mask frame 31 held by a mask holder (omitted from the drawing). A pattern hole 32a is provided, in the mask plate 32, at a position corresponding to a print area on the substrate 5. The squeegee unit 33 is disposed on the mask plate 32 so as to be movable by means of the squeegee moving mechanism 37.

The squeegee unit 33 is configured such that two squeegee elevation mechanisms 35 for elevating or lowering the pair of mutually-opposed squeegees 36 are disposed on a horizontal moving plate 34. The squeegee moving mechanism 37, in which a feed screw 37b to be rotationally driven by a squeegee moving motor 37 is screw-engaged with a nut member 37c secured on a lower surface of the moving plate 34 horizontally, moves the squeegee unit 33 forward and backward along the direction Y. The mask plate 32, the moving plate 34, and the squeegee moving mechanism 37, and the like, of the first screen printing section 7A, among the first screen printing section 7A and the second screen printing section 7B, are omitted from FIG. 2.

As shown in FIG. 2, a head X-axis table 40X that is actuated in the Y direction by means of a head Y-axis table 40Y is disposed at an elevated position above the substrate positioning section 21. The head X-axis table 40X is equipped with a camera head unit 38 and a mask cleaning unit 39. Further, the camera head unit 38 is equipped with a substrate recognition camera 38a for capturing an image of the substrate 5 from above and a mask recognition camera 38b for capturing an image of the mask plate 32 from its lower surface. The mask cleaning unit 39 has a cleaning head for cleaning a lower surface of the mask plate 32.

The camera head unit 38 and the mask cleaning unit 39 are horizontally moved by actuating the head X-axis table 40× and the head Y-axis table 40Y, whereby recognition of the substrate 5 and recognition of the mask plate 32 can simultaneously be carried out. When necessary, the lower surface of the mask plate 32 can be cleaned. When these operations are not performed, the camera head unit 38 and the mask cleaning unit 39 remain situated at positions that are receded sideways from elevated positions above the substrate positioning section 21.

Printing operation of the first screen printing section 7A and printing operation of the second screen printing operation 7B are now described. First, the substrate conveyance rails 28 carry the substrate 5 to be printed into the print position, where the substrate is positioned with respect to the substrate support section 27. Next, the second Z-axis table 27 is caused to ascend by actuation of the second Z-axis table 26, thereby supporting a lower surface of the substrate 5. The substrate positioning section 21 is then actuated, to thus position the substrate 5 with respect to the mask plate 32. Subsequently, the first Z-axis table 25 is actuated, to thus elevate the substrate 5 along with the substrate conveyance rails 28 so as to contact the lower surface of the mask plate 32 having the pattern hole 32a.

Subsequently, the clamp mechanism 29 clamps the substrate 5, whereby a horizontal position of the substrate 5 is fixed. One of the two squeegees 36 is lowered in this state so as to come into contact with the mask plate 32. Next, the squeegee 36 is caused to slide over the mask plate 32 supplied with paste, such as cream solder, in a squeezing direction (the Y direction), whereby the paste is printed on the substrate 5 by way of the pattern hole 32a.

As shown in FIGS. 2 and 3, the substrate conveyance section 8 is disposed, on the upper surface of the base 6, at an intermediate position between the first screen printing section 7A and the second screen printing section 7B along the center line CL and in the X direction. The substrate conveyance section 8 is configured such that substrate conveyance rails 8b equipped with a conveyor mechanism for the purpose of conveying a substrate are held on upper ends of respective frames 8a set upright on the base 6, so that the substrate 5 can be carried in both forward and backward directions by means of the substrate conveyance rails 8b.

Specifically, the conveyor mechanism of the substrate conveyance rails 8b is moved toward the downstream side, whereby the substrate 5 supplied from an upstream machine can be sent to a downstream machine by means of bypassing the first screen printing section 7A and the second screen printing section 7B. In this case, the substrate conveyance section 8 functions as a conveyance bypass for letting the substrate 5 delivered to the downstream machine pass. Further, the conveyor mechanism of the substrate conveyance rails 8b are actuated in an upstream direction, whereby the substrate 5 returned from the downstream machine can be returned to the upstream side of the printer 2. In this case, the substrate conveyance section 8 acts as a return conveyance path for conveying the substrate that returns from the downstream side of the electronic component mounting line 1 to the upstream side of the screen printer 2.

The substrate sorter 4(1) disposed on the upstream side of the printer 2 has sorting conveyors 41A, 41B, and 41C, each of which has a conveyor mechanism for conveying a substrate, and the substrate sorter 4(2) adjacently disposed on the downstream side of the printer 2 has sorting conveyors 42A, 42B, and 42C. The sorting conveyors 41A, 41B, 41C, 42A, 42B, and 42C are individually movable in the Y direction (see arrows a1, a2, a3, b1, b2, and b3) by means of respective conveyance rail moving mechanisms (omitted from the drawing).

By means of movement of the sorting conveyors in the Y direction, the substrate sorter 4(1) can couple the sorting conveyors 41A and 41B, which usually remain coupled to the substrate conveyance rails 28 of the first screen printing section 7A and the second screen printing section 7B, to the substrate conveyance rails 8b of the substrate conveyance section 8, as required. At this time, the sorting conveyor 41B recedes from the position where the conveyor is coupled to the corresponding substrate conveyance rails 8b. Moreover, in normal times, the sorting conveyor 41B coupled to the substrate conveyance section 8 can be coupled to the substrate conveyance rails 28 of the first screen printing section 7A and the substrate conveyance rails 28 of the second screen printing section 7B, as required. At this time, the sorting conveyors 41A and 41B recede from the positions where the conveyors are coupled to their corresponding substrate conveyance rails 28.

Moreover, in the substrate sorter 4(2), the sorting conveyors 42A and 42B coupled to the substrate conveyance rails 28 of the first screen printing section 7A and the substrate conveyance rails 28 of the second screen printing section 7B in normal times can be coupled to their corresponding substrate conveyance rails 12A and 12B of the loader 3(1), as necessary. The printed substrates 5 can be sent from the substrate positioning section 21 of the first screen printing section 7A and the substrate positioning section 21 of the second screen printing section 7B to the loader 3(1) that is a downstream machine.

Substrate conveyance operation of the printer 2 is now described by reference to FIGS. 5 and 6. The substrate 5 serving as an object of mounting is herein a two-sided mount substrate on both sides of which electronic components are to be mounted. There is illustrated example operation performed when the substrate conveyance section 8 is used as a return conveyance path for returning a substrate 5*, which has finished undergoing operation for mounting components on a lower surface of the substrate, to the upstream side of the printer 2 of interest. Specifically, as shown in FIG. 5, operation for printing paste on a first side (an upper surface) that first undergoes mounting operation is carried out by the screen printing section on one side of the printer 2 (the first screen printing section 7A in the embodiment). Therefore, a new substrate 5 that has not yet undergone printing operation is carried into the sorting conveyor 41A coupled to the substrate conveyance rails 28 of the first screen printing section 7A (as designated by an arrow "c").

The substrate 5 is sent from the sorting conveyor 41A to the substrate positioning section 21 of the first screen printing section 7A (as designated by an arrow "d"), where the screen printing mechanism of the first screen printing section 7A performs printing operation. The substrate 5 having undergone printing operation is sent to the sorting conveyor 42A of the substrate sorter 4(2) (as designated by an arrow "e"). Next, the sorting conveyor 42A moves in the Y direction, to thus become coupled to the substrate conveyance rails 12A of the loader 3(1), whereby the substrate 5 is sent to the substrate conveyance lane L1 of the loader 3(1) (see FIG. 1). The substrate 5 moves to the downstream side along the substrate conveyance lane L1, whereby the loader 3(1) and the loader 3(2) subject the substrate 5 having undergone printing operation to predetermined component mounting operation intended for the first side.

Subsequently, the substrate 5 having undergone component loading operation is sent further to a downstream reflow machine (omitted from the drawing), to thus undergo processing relating to a predetermined reflow process, with the result that the component mounting operation intended for the upper surface of the substrate 5 is completed. As mentioned above, the substrate 5 having finished undergoing operation for mounting electronic components on an upper surface is conveyed in the direction of the upstream side while turned inside out and while its lower surface, which is a second surface side, is directed upward (the substrate remaining in this attitude is written as a substrate 5* so as to be distinguished from the substrate 5 whose upper surface is directed upward) by way of the substrate conveyance lane L2 of the loader 3(1) and the loader 3(2). The substrate 5* is sent to the sorting conveyor 42C of the substrate sorter 4(2) (as designated by an arrow "f"). Further, the substrate is sent from the sorting conveyor 42C to the substrate conveyance rails 8b of the substrate conveyance section 8 (as designated by an arrow "g"). The substrate 5* conveyed by the substrate conveyance section 8 up to the upstream side of the printer 2 undergoes printing operation intended for a lower surface; hence, the substrate sorter 4(1) shifts the substrate toward the second screen printing section 7B.

Shift-conveyance of the substrate 5* may also be performed according to a method (as designated by an arrow "h") for conveying the substrate 5*, which has been sent from the substrate conveyance section 8 to the sorting conveyor 41C, to the sorting conveyor 41B by manpower or transporting the same by means of a transfer machine. Moreover, shift-conveyance of the substrate 5* may also be performed by sliding the sorting conveyor 41C or the sorting conveyor 41B in the Y direction.

Specifically, the sorting conveyor 41C received the substrate 5* from the substrate conveyance section 8 may also be moved toward the second screen printing section 7B, to thus become coupled to the substrate conveyance rails 28, thereby sending the substrate 5* to the second screen printing section 7B. Alternatively, the sorting conveyor 41B moved toward the substrate conveyance section 8 may also receive the substrate 5*, and the sorting conveyor 41 returned to the second screen printing section 7B may be coupled to the substrate conveyance rails 28, thereby sending the substrate 5* to the second screen printing section 7B.

Subsequently, the substrate 5* is sent to the substrate positioning section 21 of the second screen printing section 7B (as designated by an arrow "i"), where the substrate undergoes printing operation performed by the second screen printing section 7B. The substrate 5* having undergone printing operation is sent to the sorting conveyor 42B of the substrate sorter 4(2) (as designated by an arrow "j"). The sorting conveyor 42B then moves in the Y direction, to thus become coupled to the substrate conveyance rails 12B of the loader 3(1), whereby the substrate 5* is sent to the substrate conveyance lane L3 of the loader 3(1) (see FIG. 1). As a result of the substrate 5* moving to the downstream side along the substrate conveyance lane L3, the loader 3(1) and the loader 3(2) subject the substrate 5* having undergone printing operation to predetermined component loading operation intended for a lower surface.

FIG. 6 shows substrate conveyance operation that is performed in a state where the electronic component mounting operation intended for a two-sided mounted substrate by the electronic component mounting line 1 is steadily performed. Specifically, in the first screen printing section 7A, the substrate 5 is sent from the sorting conveyor 41A to the substrate conveyance rails 28, and the substrate positioning section 21 positions the substrate. The substrate 5 in this state is subjected to printing operation performed by the first screen printing section 7A. The substrate 5 having finished undergoing printing operation is delivered to a downstream machine by way of the sorting conveyor 42A. Further, the substrate conveyance section 8 performs substrate return conveyance operation for conveying the substrate 5*, which has been returned from the downstream machine by way of the sorting conveyor 42C, to the upstream side and sending the substrate to the sorting conveyor 41C.

Further, in the second screen printing section 7B, the substrate 5* shifted and conveyed from the substrate conveyance section 8 is again charged into the substrate positioning section 21 by way of the substrate conveyance rails 28. The substrate 5* then undergoes printing operation performed by the second screen printing section 7B. The substrate 5 having undergone printing operation is sent to a downstream machine by way of the sorting conveyor 42B. In the configuration, the substrate sorter 4(1) acts as a substrate recharge section that again charges the substrate 5*, which has been returned to the upstream side of a corresponding screen printer by the substrate conveyance section 8 acting as the return conveyance path, into the substrate positioning section 21 of the printer 2. The substrate sorter 4(2) acts as a substrate delivering/receiving section that delivers and receives the substrate 5 between the substrate positioning section 21 of the printer 2 or the substrate conveyance section 8 and the loader 3 that is a downstream machine situated on the downstream side of the printer 2.

(Second Embodiment)

Figure 7:
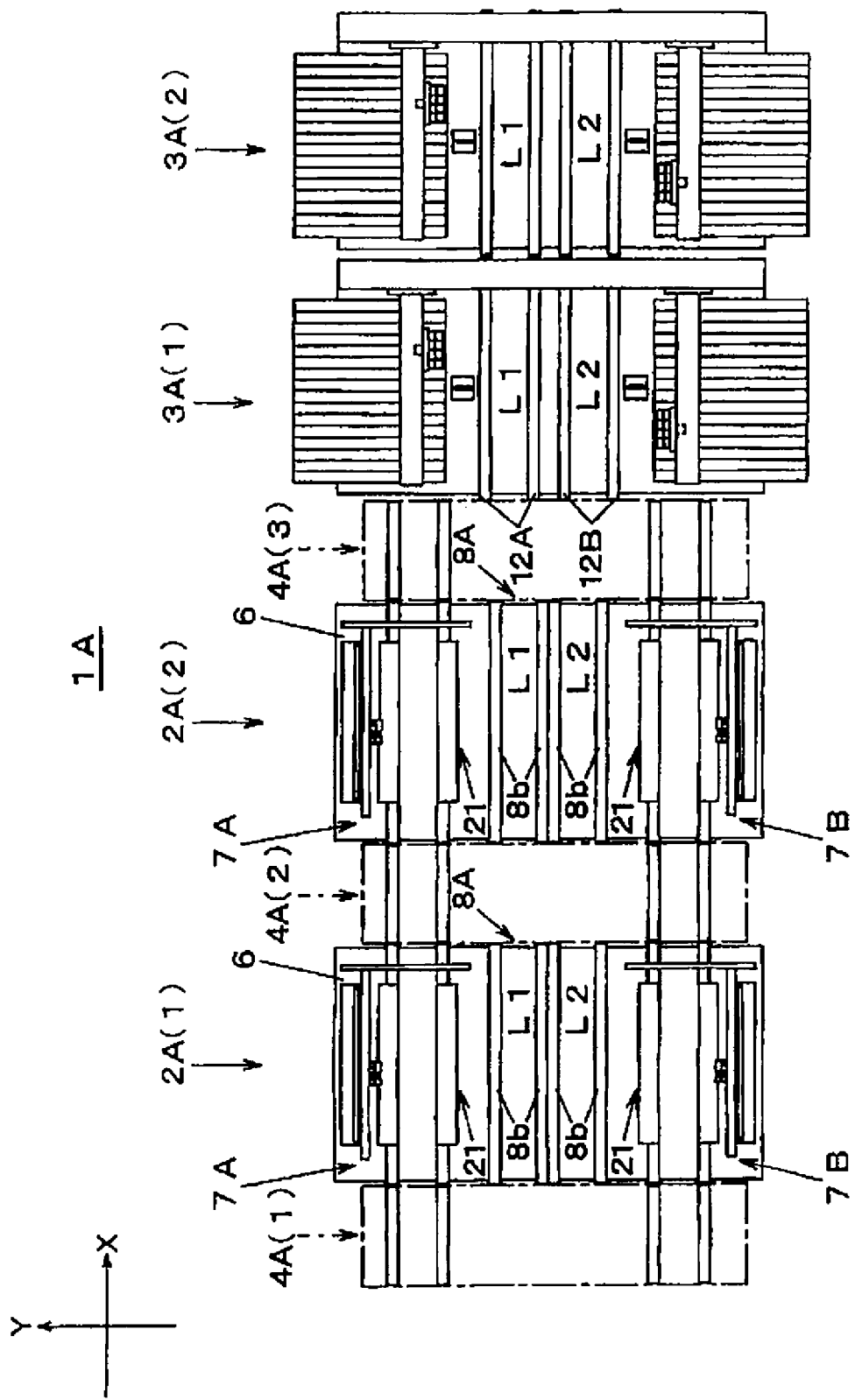
FIG. 7 is a plan view showing a configuration of an electronic component mounting line of a second embodiment of the present invention.
Figure 8:
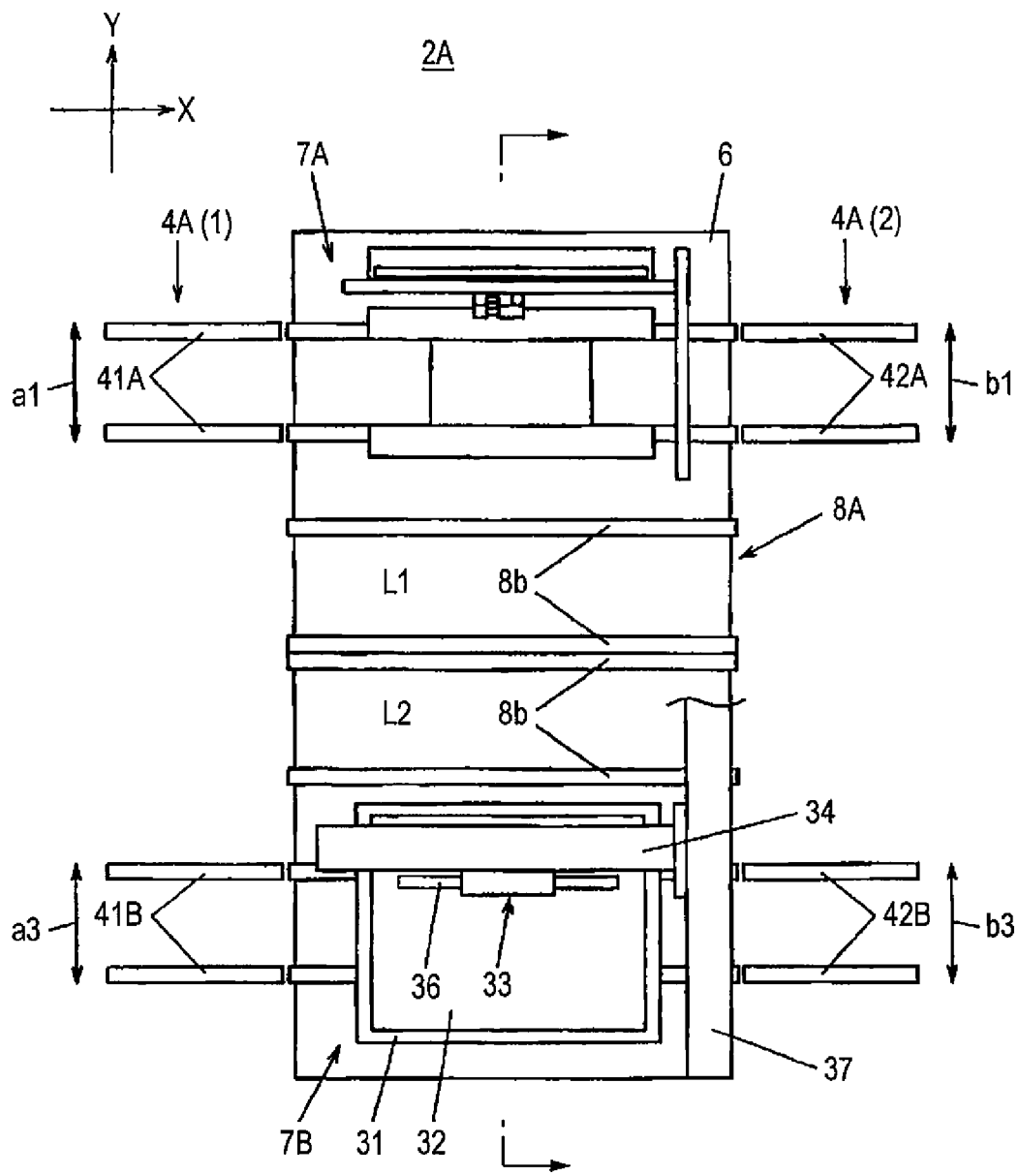
FIG. 8 is a plan view showing a screen printer of the second embodiment of the present invention.
Figure 9:
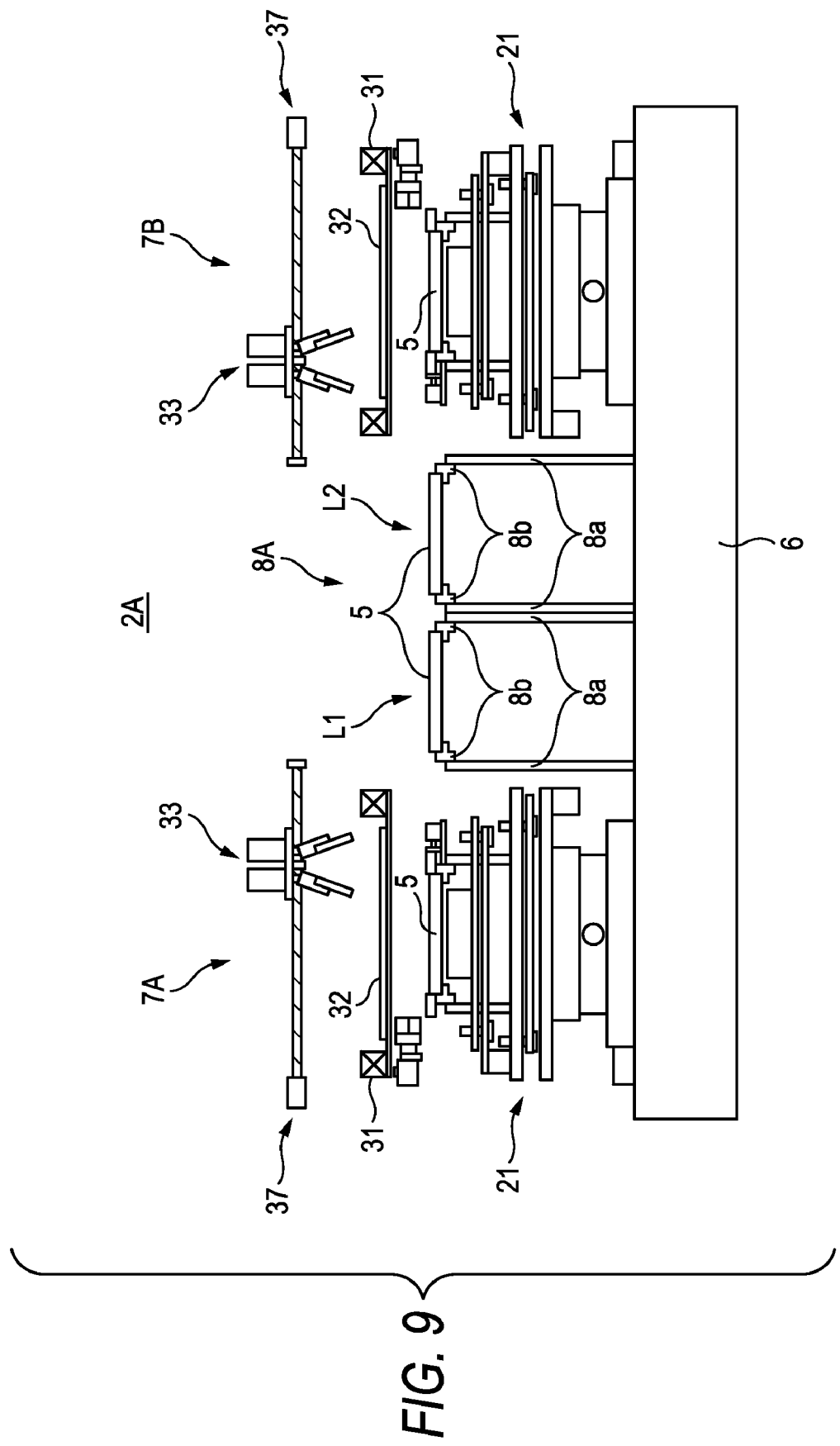
FIG. 9 is a cross-sectional view of the screen printer of the second embodiment of the present invention.
Figure 10:
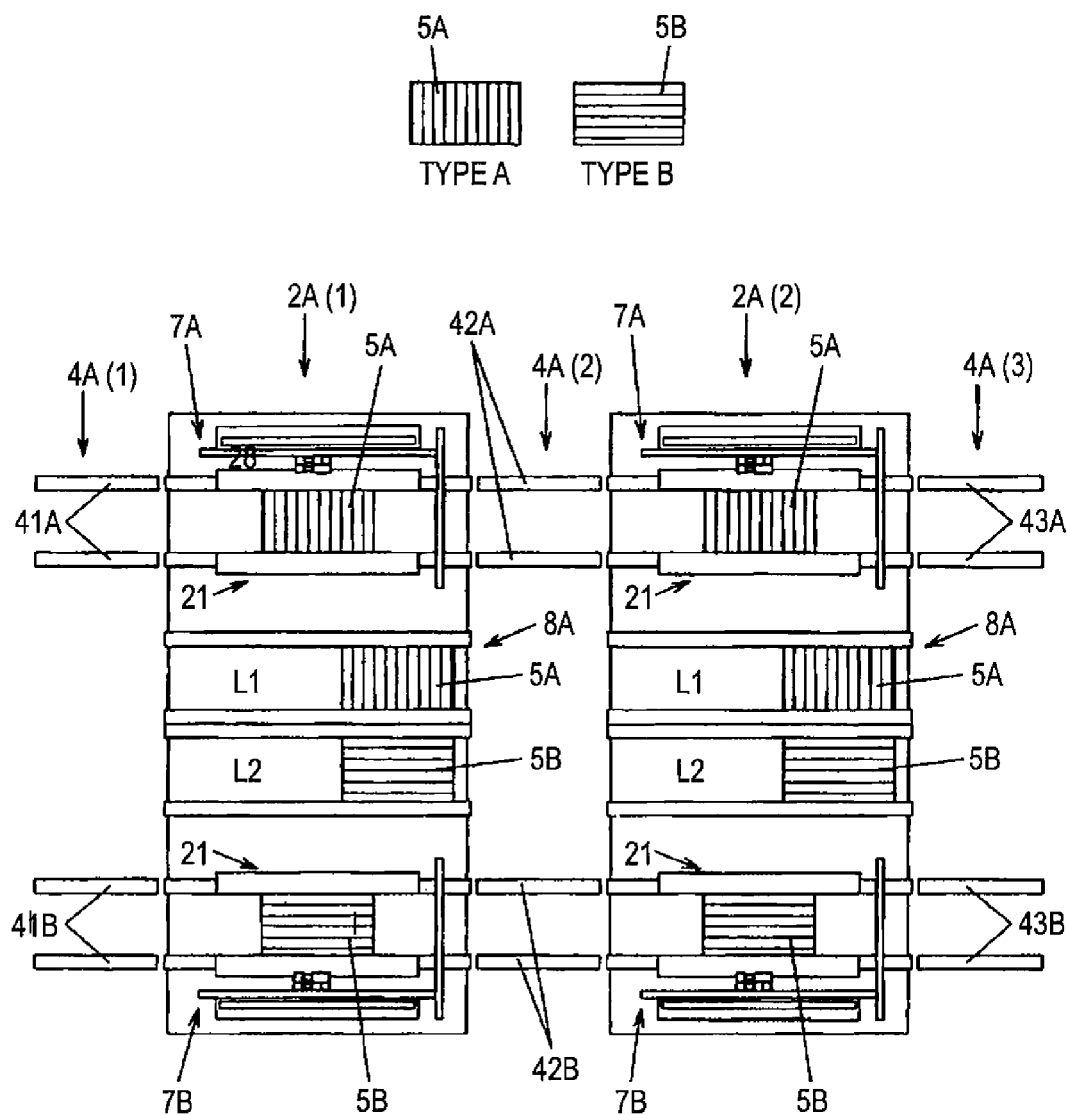
FIG. 10 is a descriptive operation diagram of substrate conveyance motion performed by the screen printer of the second embodiment of the present invention.
Figure 11:
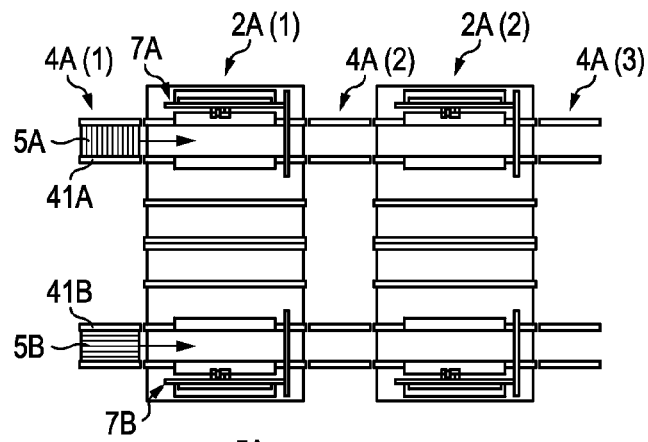
FIG. 11 is a descriptive operation diagram of substrate conveyance motion performed by the screen printer of the second embodiment of the present invention.
Figure 11:
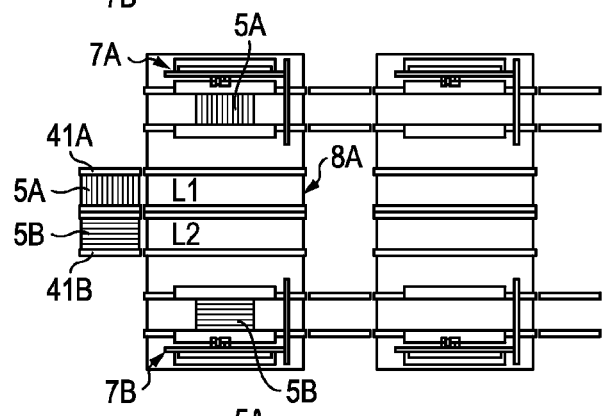
Figure 11:
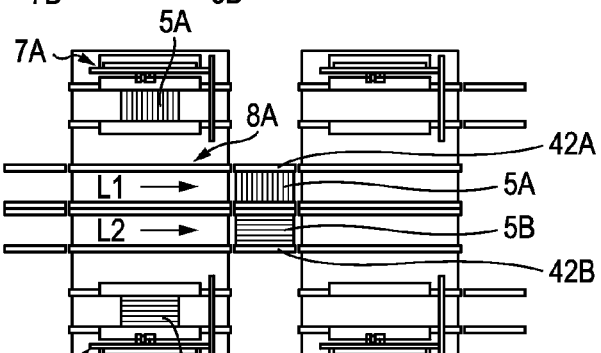
Figure 11:
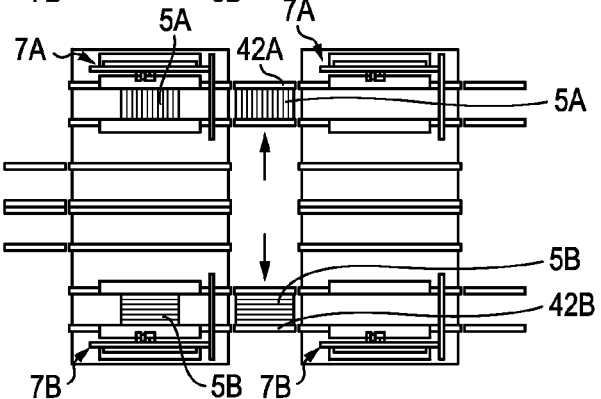
Figure 12:
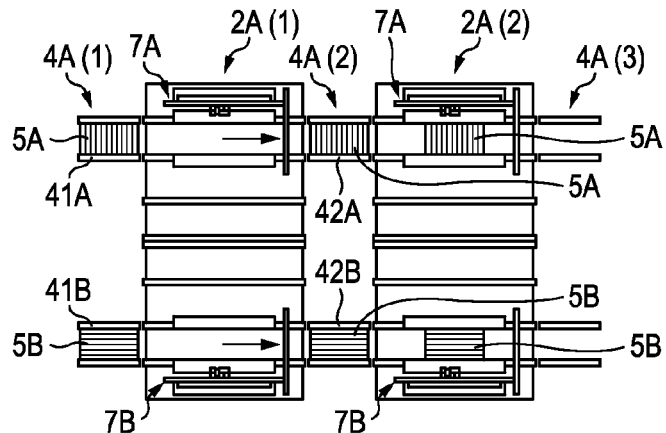
FIG. 12 is a descriptive operation diagram of substrate conveyance motion performed by the screen printer of the second embodiment of the present invention.
Figure 12:
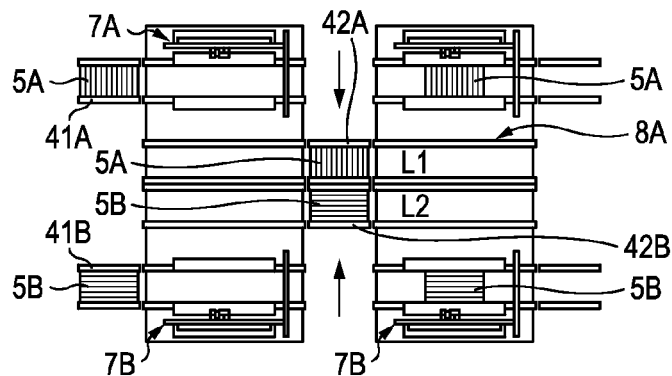
Figure 12:
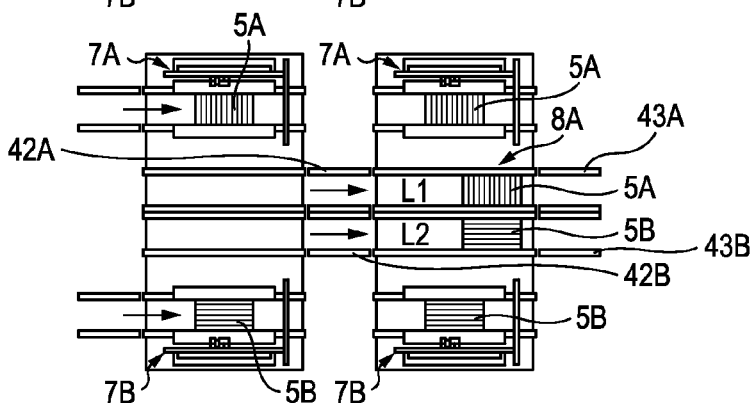
Figure 12:
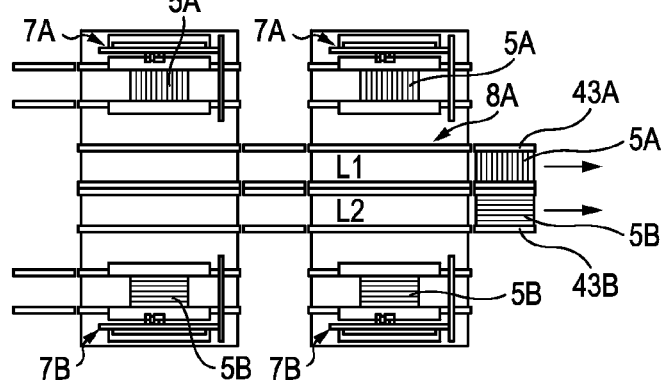

FIG. 7 is a plan view showing a configuration of an electronic component mounting line of a second embodiment of the present invention. FIG. 8 is a plan view showing a screen printer of the second embodiment of the present invention. FIG. 9 is a cross-sectional view of the screen printer of the second embodiment of the present invention. FIG. 10, FIG. 11, and FIG. 12 are descriptive operation diagrams of substrate conveyance motion of the screen printer of the second embodiment of the present invention.

First, a configuration of an electronic component mounting line 1A is described by reference to FIG. 7. The electronic component mounting line 1A has a function of manufacturing a mounted substrate by mounting electronic components on a substrate, as does the electronic component mounting line 1 described in connection with the first embodiment; and is configured such that printers 2A that each print electronic component bonding paste on a substrate are coupled to an upstream side of an electronic component loader 3A that mounts electronic components on a substrate. In the second embodiment, respective downstream sides of the two printers 2A arranged in series are coupled to two loaders 3A(1) and 3A(2) similarly arranged in series.

In order to deliver and receive the substrate among the machines, a substrate sorter 4A(1) is adjacently disposed at an upstream side of a printer 2A(1); a substrate sorter 4A(2) is adjacently disposed between the printer 2A(1) and a printer 2A(2); and a substrate sorter 4A(3) is adjacently disposed on a downstream side of the printer 2A(2). Specifically, the substrate carried out of the upstream machine is carried into the printer 2A(1) by way of the substrate sorter 4A(1) and further into the printer 2A(2) by way of the substrate sorter 4A(2). The substrate having undergone printing operation performed by the printer 2A(1) or the printer 2A(2) is delivered to the loader 3(1) by way of the substrate sorter 4A(3).

The printer 2A is configured in such a way that a first screen printing section 7A and a second screen printing section 7B, which are analogous to their counterparts describe in connection with the first embodiment in terms of a configuration and a function, are symmetrically arranged on the common base 6 with respect to the center line CL of the electronic component mounting line 1 when viewed in plane. A substrate conveyance section 8A that conveys the substrate 5 forwardly or backwardly along the direction of conveyance of a substrate (i.e., the X direction) is disposed between the first screen printing section 7A and the second screen printing section 7B.

As shown in FIGS. 8 and 9, the substrate conveyance section 8A is configured in such a way that two rows of substrate conveyance rails 8b, which each have a conveyance mechanism for the purpose of conveying a substrate, are adjacently provided side by side on upper ends of frames 8a disposed upright on the base 6. The printer 2A is configured so as to have two substrate conveyance lanes L1 and L2 that convey the substrate 5 in the direction of conveyance of a substrate (the X direction). Specifically, in the second embodiment, the substrate conveyance section 8 is configured so as to have a plurality of substrate conveyance lanes (substrate conveyance paths) for conveying the substrate 5. As will be described later, the plurality of substrate conveyance lanes assume a form including a conveyance bypass for letting a substrate sent to a downstream machine pass through.

The substrate sorters 4A(1) to 4A(3) assume an identical configuration. As shown in FIG. 8, the substrate sorters 4A(1) to 4A(3) are configured such that the substrate sorting conveyors (the sorting conveyors 41C and 42C) located at the center are omitted from the configuration of the substrate sorter 4 described in connection with the first embodiment. Specifically, the substrate sorter 4A(1) has sorting conveyors 41A and 41B; the substrate sorter 4A(2) has sorting conveyors 42A and 42B; and the substrate sorter 4A(3) has sorting conveyors 43A and 43B. The substrate sorting conveyors are arranged so as to be movable in the Y direction.

A configuration of the loader 3A is now described. The loader 3A(1) and the loader 3A(2) are structurally identical with each other. The loader 3A is different from the loader 3 described in connection with the first embodiment in connection with the configuration of the substrate conveyance path laid in the center along the direction of conveyance of a substrate (the X direction). In other respects, the loader 3A has the same configuration as that of the loader 3. Specifically, the two pairs of substrate conveyance rails 12A and 12B are laid in parallel to each other in the loader 3A. The substrate conveyance rails 12A and 12B make up the respective substrate conveyance lanes L1 and L2 that convey the substrates 5 sent from the upstream side by way of the substrate sorter 4A(3).

In the substrate sorter 4A(3), by means of movement of the sorting conveyors 43A and 43B the substrates 5 can be delivered or received between the substrate conveyance lanes L1 and L2 of the loader 3A(1) and the substrate conveyance lanes L1 and L2 of the printer 2A(2) by way of the sorting conveyors 43A and 43B. Likewise, by means of movement of the sorting conveyors 43A and 43B the respective substrate positioning sections 21 of the first screen printing section 7A and the second screen printing section 7B in the printer 2A(2) can deliver the substrates 5 to the substrate conveyance lanes L1 and L2 of the loader 3A(1). Each of the substrate conveyance lanes L1 and L2 has a mounting stage for performing mounting operation while positioning the substrate 5 at the mounting position. The substrate 5 positioned on the mounting stage is subjected to operation for transferring and mounting electronic components, by means of the component loading mechanisms analogous to the loader 3 described in connection with the first embodiment.

By reference to FIGS. 10, 11, and 12, substrate conveyance operation of the printer 2A is now descried. There is illustrated example substrate conveyance operation performed when two different types of substrates 5 (a substrate 5A and a substrate 5B) are concurrently subjected to printing operation. FIG. 10 shows general work classification effected when the two printers 2A(1) and 2A(2) subject the two types of substrates 5A and 5B to printing operation.

Specifically, the substrates 5A and 5B are carried into the corresponding sorting conveyors 41A and 41B of the substrate sorter 4A(1) while classified from each other according to a type. The substrate 5 is subjected to printing operation performed by the first screen printing section 7A of either the printer 2A(1) or the printer 2A(2), and the substrate B is subjected to printing operation performed by the second screen printing section 7B of either the printer 2A(1) or the printer 2A(2). When the printer 2A(1) is unoccupied, the substrates 5A and 5B supplied from the upstream side are carried into the first screen printing section 7A and the second screen printing section 7B of the printer 2A(1), where the substrates undergo printing operation. The substrates 5A and 5B having undergone printing operation are sent to the substrate conveyance sections 8A of the printer 2A(2) by way of the substrate sorter 4A(2). Subsequently, the substrates are conveyed toward the downstream side in a bypassing manner and further sent to the loader 3, which is a downstream machine, by way of the substrate sorter 4A(3).

When the printer 2A(1) is in the course of printing operation, the substrates 5A and 5B supplied from the upstream side are conveyed to the downstream side in a bypassing manner by way of the substrate sorter 4A(1) and the substrate conveyance section 8A of the printer 2A(1). The substrates are then carried into the first screen printing section 7A and the second screen printing section 7B of the printer 2A(2) by way of the substrate sorter 4A(2), with the result that the substrates undergo printing operation. The substrates 5A and 5B that have finished undergoing printing operation are sent to the loader 3, which is a downstream machine, by way of the substrate sorter 4A(3). Specifically, during the substrate conveyance operation, the substrate sorters 4A(2) and (3) act as substrate delivering/receiving sections that deliver or receive the substrate 5 between the substrate positioning section 21 or the substrate conveyance section 8 and the downstream machine situated on the downstream side of the printer 2A.

Detailed substrate conveyance operation is described by reference to FIGS. 11 and 12. First, as shown in FIG. 11(*a*), the substrate 5A is carried into the sorting conveyor 41A of the substrate sorter 4A(1), and the substrate 5B is carried into the sorting conveyor 41B of the substrate sorter 4A(1). Next, as shown in FIG. 11(b), the substrate 5A is carried into the first screen printing section 7A of the printer 2A(1), where the substrate undergoes printing operation. The substrate 5B is carried into the second screen printing section 7B of the printer 2A(1), where the substrate undergoes printing operation. In the substrate sorter 4A(1), the sorting conveyors 41A and 41B received new substrates 5A and 5B supplied from the upstream side are moved at this time toward the substrate conveyance section 8A of the printer 2A(1), and the sorting conveyors 41A and 41B are coupled to the substrate conveyance lanes L1 and L2.

As shown in FIG. 11(c), during the course of the substrates 5A and 5B undergoing printing operation performed by the first screen printing section 7A and the second screen printing section 7B, the substrates 5A and 5B are carried in a bypassing manner by way of the substrate conveyance lanes L1 and L2 of the substrate conveyance section 8A. In the substrate sorter 4A(2), the substrates 5A and 5B are sent to the sorting conveyors 42A and 42B that have already moved to the location where the sorting conveyors are coupled to the respective substrate conveyance lanes L1 and L2 of the substrate conveyance section 8A. As shown in FIG. 11(d), the sorting conveyors 42A and 42B received the substrates 5A and 5B are moved to the first screen printing section 7A and the second screen printing section 7B of the printer 2A(2).

Subsequently, as shown in FIG. 12(a), the substrates 5A and 5B are carried from the sorting conveyors 42A and 42B into the first screen printing section 7A and the second screen printing section 7B of the printer 2A(2), where the substrates undergo printing operation. Further, the substrates 5A and 5B that have undergone printing operation in the first screen printing section 7A and the second screen printing section 7B of the printer 2A(1) are delivered to the sorting conveyors 42A and 42B, respectively. Next, as shown in FIG. 12(b), the sorting conveyors 42A and 42B received the substrates 5A and 5B move toward the substrate conveyance section 8A of the printer 2A(2), to thus become coupled to the respective substrate conveyance lanes L1 and L2. At this time, in the substrate sorter 4A(1), new substrates 5A and 5B are carried into the sorting conveyors 41A and 41B.

Subsequently, as shown in FIG. 12(c), the substrates 5A and 5B that have undergone printing operation are sent from the respective sorting conveyors 42A and 42B to the substrate conveyance lanes L1 and L2 of the substrate conveyance section 8A of the printer 2A(2), to thus be conveyed to the downstream side in a bypassing manner. Concurrently, new substrates 5A and 5B are carried from the respective sorting conveyors 41A and 41B into the first screen printing section 7A and the second screen printing section 7B of the printer 2A(1), respectively, where the substrates undergo printing operation. As shown in FIG. 12(d), the substrates 5A and 5B conveyed so as to bypass the substrate conveyance section 8A of the printer 2A(2) after having undergone printing operation are sent to the sorting conveyors 43A and 43B of the substrate sorter 4A(3) and further to the loader 3A that is a downstream machine. In subsequent operation, analogous substrate conveyance operation intended for the substrate 5A and the substrate 5B are repeatedly performed.

(Third Embodiment)

Figure 13:
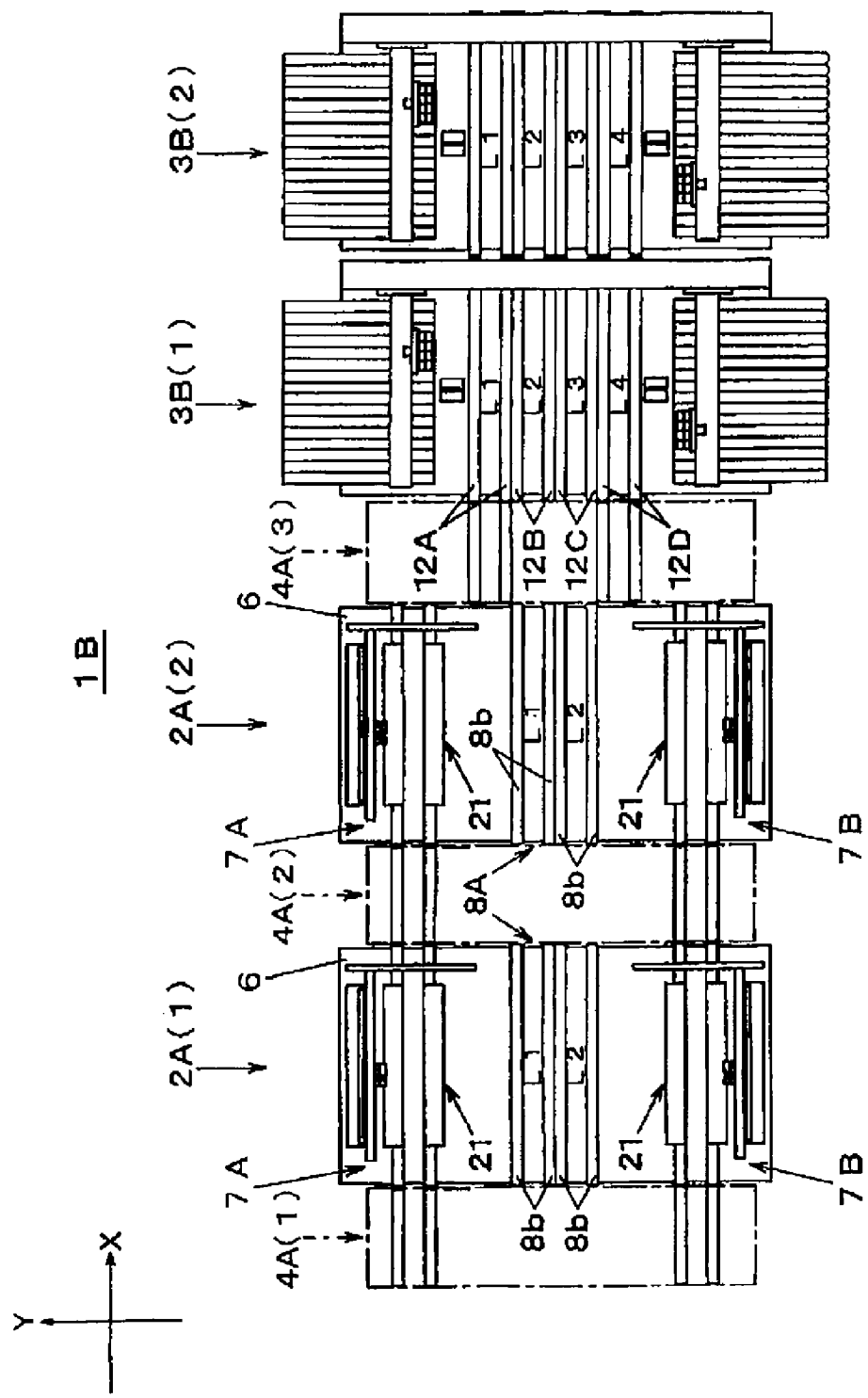
FIG. 13 is a plan view showing a configuration of an electronic component mounting line of a third embodiment of the present invention.
Figure 14:
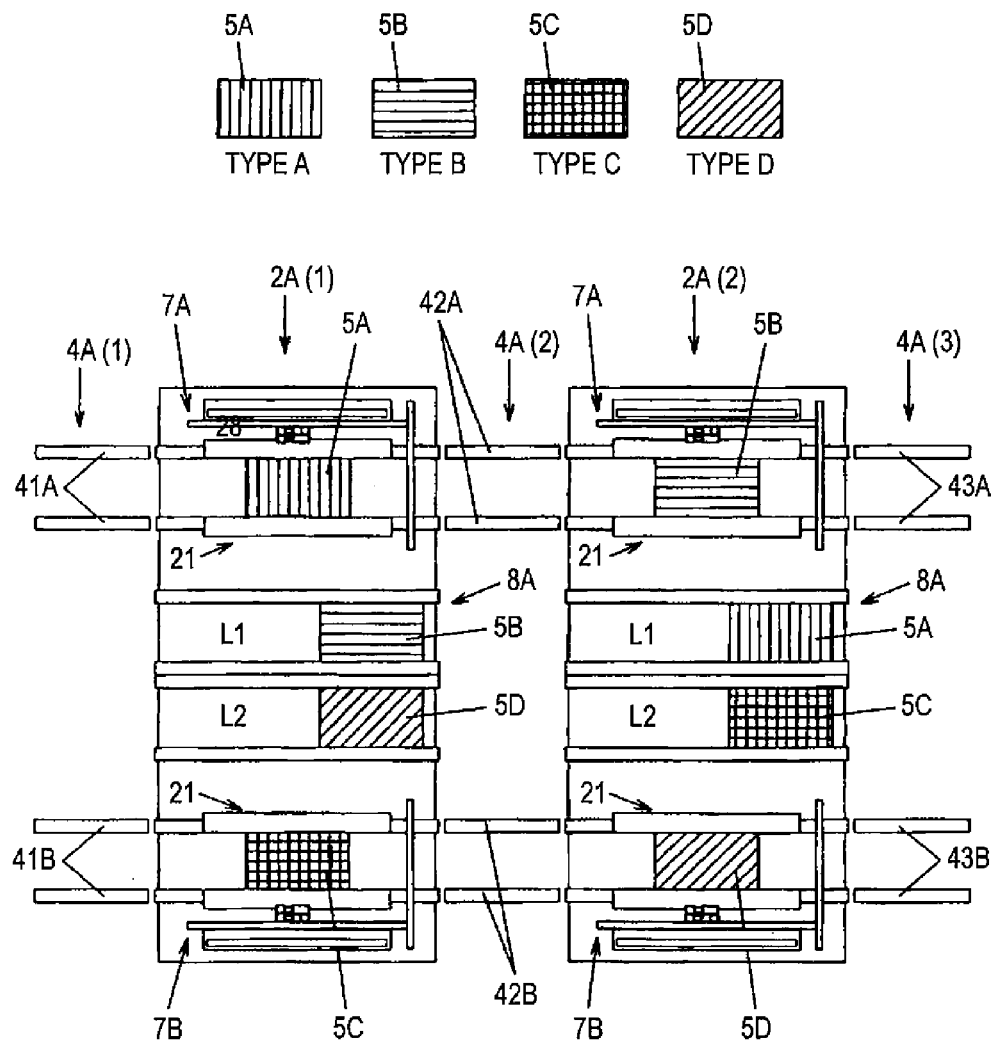
FIG. 14 is a descriptive operation diagram of substrate conveyance motion of a screen printer of the third embodiment of the present invention.
Figure 15:
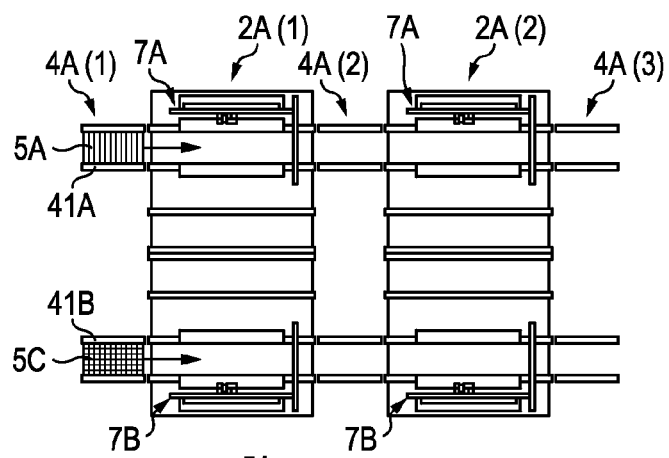
FIG. 15 is a descriptive operation diagram of substrate conveyance motion of the screen printer of the third embodiment of the present invention.
Figure 15:
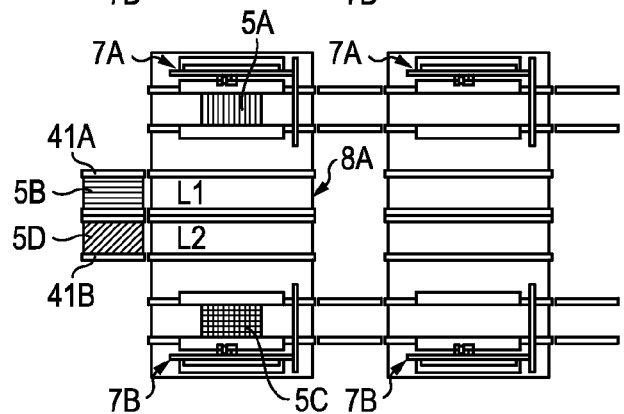
Figure 15:
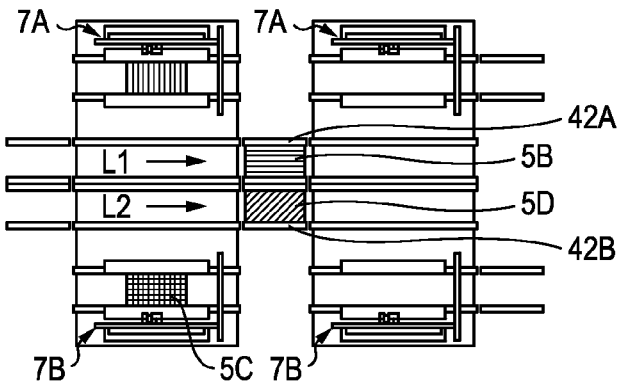
Figure 15:
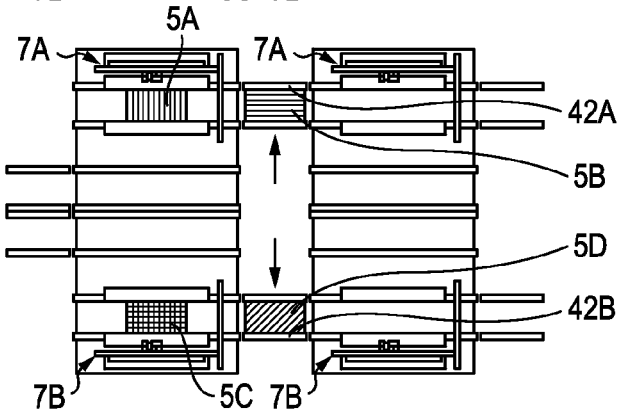
Figure 16:
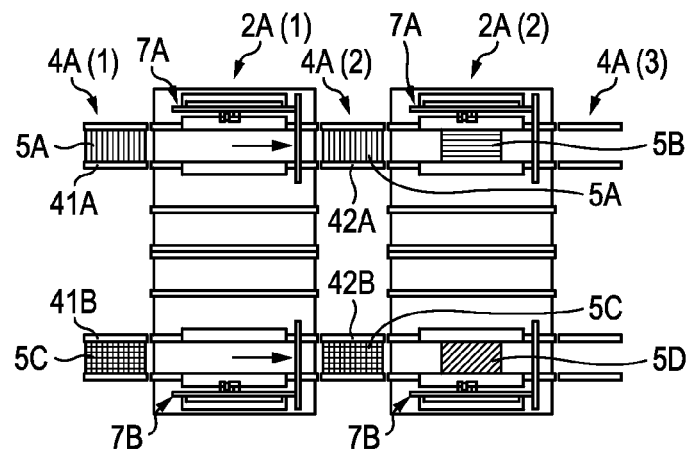
FIG. 16 is a descriptive operation diagram of substrate conveyance motion of the screen printer of the third embodiment of the present invention.
Figure 16:
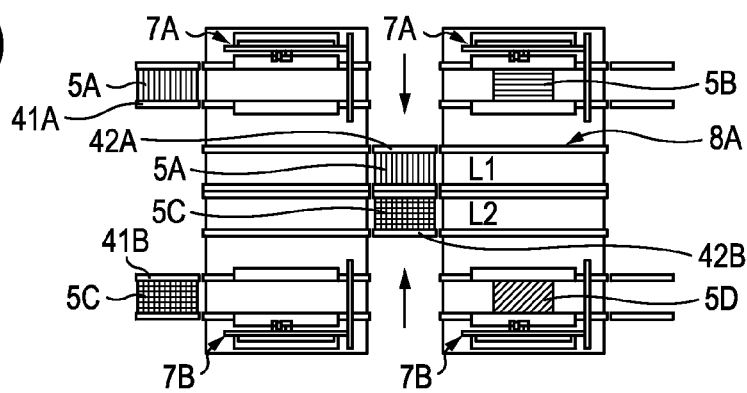
Figure 16:
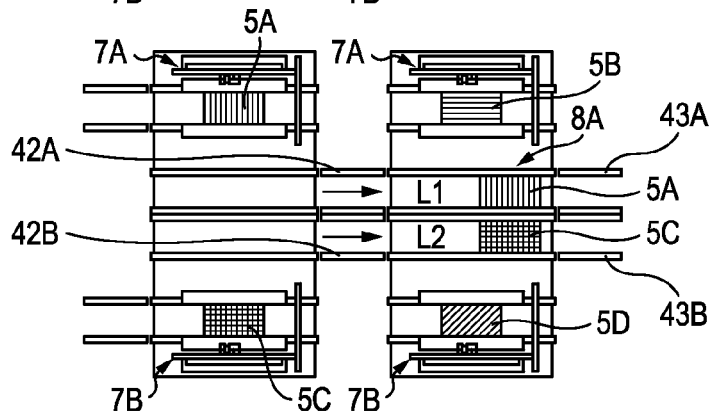
Figure 16:
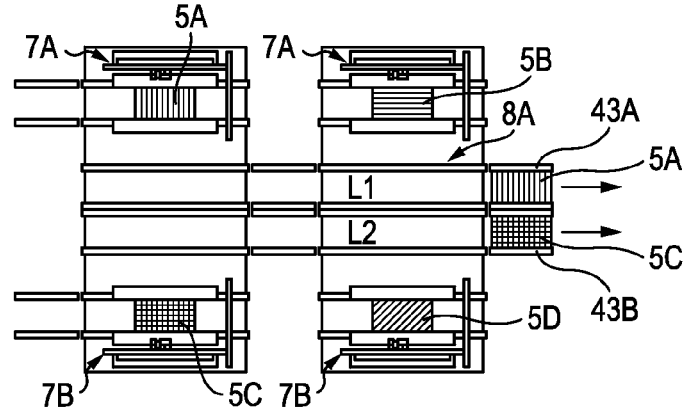

FIG. 13 is a plan view showing a configuration of an electronic component mounting line of a third embodiment of the present invention, and FIGS. 14, 15, and 16 are descriptive operation diagrams of substrate conveyance motion of a screen printer of the third embodiment of the present invention.

First, a configuration of an electronic component mounting line 1B is described by reference to FIG. 13. The electronic component mounting line 1B has a function of manufacturing a mounted substrate by mounting electronic components on a substrate as does the electronic component mounting line 1 described in connection with the first embodiment; and is configured in such a way that the screen printer 2A that prints electronic component bonding paste on a substrate is coupled to an upstream side of a loader 3B that mounts electronic components on a substrate. In the third embodiment, two loaders 3B(1) and 3B(2) arranged in series are coupled to respective downstream sides of the two series-arranged printers 2A as in the case of the second embodiment.

In order to deliver and receive the substrates among the machine, the substrate sorter 4A(1) is adjacently disposed on the upstream side of the printer 2A(1). The substrate sorter 4A(2) is adjacently interposed between the printer 2A(1) and the printer 2A(2). The substrate sorter 4A(3) is adjacently disposed on the downstream side of the printer 2A(2). The substrate sorters 4A(1) to (3) have the same configuration as their counterparts described in connection with the second embodiment. The substrates carried out of the upstream machine are carried into the printer 2A(1) by way of the substrate sorter 4A(1) and further into the printer 2A(2) by way of the substrate sorter 4A(2). The substrates that have undergone printing operation in the printer 2A(1) or the printer 2A(2) are delivered to the loader 3B(1) by way of the substrate sorter 4A(3).

A configuration of the loader 3B is now described. The loader 3B(1) and the loader 3B(2) assume the same configuration. The loader 3B is different from the loader 3 described in connection with the first embodiment in that the substrate conveyance path is laid in the center along the direction of conveyance of a substrate (the X direction). In other respects, the loader 3B is structurally identical with the loader 3. Specifically, in the loader 3B, there are laid in parallel to each other four substrate conveyance rails 12A, 12B, 12C, and 12D, each of which has a conveyor mechanism for conveying a substrate. The substrate conveyance rails 12A, 12B, 12C, and 12D make up substrate conveyance lanes L1, L2, L3, and L4 that convey the substrates 5 sent from the upstream side by way of the substrate sorter 4A(3).

In the substrate sorter 4A(3), the sorting conveyors 43A and 43B are moved, thereby being able to deliver and receive the substrates 5 between the substrate conveyance lanes L1, L2, L3, and L4 of the loader 3B(1) and the substrate conveyance lanes L1 and L2 of the printer 2A, by way of the sorting conveyors 43A and 43B. Likewise, the sorting conveyors 43A and 43B are moved, whereby the substrates 5 can be delivered from the respective substrate positioning sections 21 of the first screen printing section 7A and the second screen printing section 7B of the printer 2A to the substrate conveyance lanes L1, L2, L3, and L4 of the loader 3A. Each of the substrate conveyance lanes L1, L2, L3, and L4 is equipped with the mounting stage where the substrate 5 is positioned at the mounting position and subjected to mounting operation. The component loading mechanism similar to the loader 3 described in connection with the first embodiment transfers and mounts electronic components to and on the substrate 5 positioned on the mounting stage.

By reference to FIGS. 14, 15, and 16, substrate conveyance operation of the printer 2A making up the electronic component mounting line 1B is now described. There is illustrated example substrate conveyance operation performed when four different types of substrates 5 (the substrate 5A, the substrate 5B, the substrate 5C, and the substrate 5C) are concurrently subjected to printing operation. FIG. 14 shows general work classification effected when the two printers 2A(1) and 2A(2) subject four types of substrates 5A, 5B, 5C, and 5D to printing operation.

The four types of substrates 5A, 5B, 5C, and 5D are classified into two groups. New substrates 5A and 5B that have not yet subjected to processing are first carried into the sorting conveyor 41A of the substrate sorter 4A(1) and undergo printing operation performed by the first screen printing section 7A in either the printer 2A(1) or the printer 2A(2). Moreover, new substrates 5C and 5D that have not yet subjected to processing are first carried into the sorting conveyor 41B and undergo printing operation performed by the second screen printing section 7B in either the printer 2A(1) or the printer 2A(2). Specifically, the first screen printing sections 7A and the second screen printing sections 7B of the printers 2A(1) and 2A(2) individually perform printing operations intended for different types of substrates. The four types of substrates are thereby subjected to printing concurrently.

When specific two types of substrates (the substrate 5A and the substrate 5C of the embodiment shown in FIG. 14) are objects of printing operation performed by the first screen printing section 7A and the second screen printing section 7B of the printer 2A(1), the substrate conveyance section 8A of the printer 2A(1) conveys the other two types of substrates (the substrate 5B and the substrate 5D that are objects of printing operation performed by the printer 2A(2)) to the downstream side in a bypassing manner. Likewise, when specific two types of substrates (the substrate 5B and the substrate 5D of the embodiment shown in FIG. 14) are objects of printing operation performed by the first screen printing section 7A and the second screen printing section 7B of the printer 2A(2), the substrate conveyance section 8A of the printer 2A(2) conveys the other two types of substrates (the substrate 5A and the substrate 5C that have finished undergoing printing operation by means of the printer 2A(1)) to the downstream side in a bypassing manner. All of the substrates 5A, 5B, 5C, and 5D that have finished undergoing printing operation are delivered to respective specified substrate conveyance lanes of the loader 3B(1), which is a downstream machine, by way of the substrate sorter 4A(3), to thus be conveyed to the downstream side. In the course of conveyance operation, the respective machines sequentially transfer and mount electronic components on the substrate 5A, the substrate 5B, the substrate 5C, and the substrate 5D.

Detailed substrate conveyance operation is described by reference to FIGS. 15 and 16. First, as shown in FIG. 15(*a*), the substrates 5A and 5C are carried into the sorting conveyors 41A and 41B of the substrate sorter 4A(1). Next, as shown in FIG. 15(*b*), the substrates 5A and 5C are carried into the first screen printing section 7A and the second screen printing section 7B of the printer 2A(1), where the substrates undergo printing operation. In the substrate sorter 4A(1), the sorting conveyors 41A and 41B received new substrates 5B and 5D, which have not yet undergone processing, from an upstream machine move toward the substrate conveyance section 8A of the printer 2A(1), thereby coupling the sorting conveyors 41A and 41B to the substrate conveyance lanes L1 and L2, respectively.

During the course of the substrates 5A and 5C undergoing printing operation in the first screen printing section 7A and the second screen printing section 7B, the substrates 5B and 5D are carried in a bypassing manner by way of the substrate conveyance lanes L1 and L2 of the substrate conveyance section 8A, as shown in FIG. 15(*c*). Subsequently, in the substrate sorter 4A(2), the substrates 5B and 5D are sent to the sorting conveyors 42A and 42B that have already moved to the position where the conveyors are coupled to the substrate conveyance lanes L1 and L2 of the substrate conveyance section 8A. Next, as shown in FIG. 15(*d*), the sorting conveyors 42A and 42B received the substrates 5B and 5D move toward the first screen printing section 7A and the second screen printing section 7B of the printer 2A(2).

Subsequently, as shown in FIG. 16(*a*), the substrates 5B and 5D are carried from the respective sorting conveyors 42A and 42B to the first screen printing section 7A and the second screen printing section 7B of the printer 2A(2), whereupon the substrates undergo printing operation. Concurrently, the substrates 5A and 5C that have finished undergoing printing operation in the first screen printing section 7A and the second screen printing section 7B of the printer 2A(1) are delivered to the sorting conveyors 42A and 42B. Next, as shown in FIG. 16(*b*), the sorting conveyors 42A and 42B received the substrates 5A and 5C move toward the substrate conveyance section 8A of the printer 2A(2), to thus become coupled to the substrate conveyance lanes L1 and L2, respectively. At this time, in the substrate sorter 4A(1), new substrates 5A and 5C are carried from the upstream machine to the sorting conveyors 41A and 41B.

As shown in FIG. 16(*c*), the substrates 5A and 5C that have finished undergoing printing operation are sent from the respective sorting conveyors 42A and 42B to the corresponding substrate conveyance lanes L1 and L2 of the substrate conveyance section 8A of the printer 2A(2), to thus be carried to the downstream side in a bypassing manner. Concurrently, new substrates 5A and 5C are carried from the respective sorting conveyors 41A and 41B into the first screen printing section 7A and the second screen printing section 7B of the printer 2A(1), where the substrates undergo printing operation.

As shown in FIG. 16(*d*), the substrates 5A and 5C, conveyed so as to bypass the substrate conveyance section 8A of the printer 2A(2) after having finished undergoing printing operation, are sent to the corresponding sorting conveyors 43A and 43B of the substrate sorter 4A(3), to thus be further delivered to respective specific substrate conveyance lanes of the loader 3A(1) that is a downstream machine. The substrates 5B and 5D that have finished undergoing printing operation performed by the first screen printing section 7A and the second screen printing section 7B of the printer 2A(2) are sent to the respective sorting conveyors 43A and 43B of the substrate sorter 4A(3) and likewise sent to respective specific substrate conveyance lanes of the loader 3A(1). In subsequent operation, similar substrate conveyance operation intended for the four types of substrates 5A, 5B, 5C, and 5D are repeatedly performed.

The third embodiment illustrates an example in which the two substrate conveyance lanes L1 and L2 are provided for the respective substrate conveyance sections 8A of the printers 2A(1) and 2A(2). However, three substrate conveyance lanes can also be provided in each of the substrate conveyance sections 8A. One of the three substrate conveyance lanes (e.g., the substrate conveyance path located in the center) can be caused to act as a return conveyance path for returning the two types of substrates 5A and 5B, which are turned inside out after having finished undergoing surface mounting operation, from the downstream side to the upstream side as in the first embodiment. Specifically, in this case, the plurality of substrate conveyance paths provided in the substrate conveyance section 8A assume a form including a return conveyance path for conveying a substrate that returns from the downstream side of the electronic component mounting line to the upstream side of the screen printer of interest.

In this case, the substrates 5C and 5D described in connection with the example substrate conveyance operation correspond to the substrates resultant from turning inside out of the substrates 5A and 5B. There is achieved an operation pattern in which four types of printing operations; namely, printing operations intended for both sides of the two types of substrates 5, are performed by the first screen printing sections 7A and the second screen printing sections 7B of the respective printers 2A(1) and 2A(2). In the configuration, the substrate sorter 4A(1) and the substrate sorter 4A(2) act as substrate recharging sections that recharge the substrates returned to the upstream side of the screen printer by the return conveyance paths to the substrate positioning section.

As described in connection with the first, second, and third embodiments, the screen printer of the present invention has a substrate conveyance section that conveys substrates in the direction of conveyance of a substrate and that is interposed between two screen printing sections arranged symmetrically with reference to the center line of the electronic component mounting line when viewed in plane. A variety of substrate conveyance forms appropriate for substrate operation paths in the electronic component mounting line thereby become possible.

For instance, as indicated by the example of the first embodiment, the substrate conveyance section 8 is used as a return conveyance path that conveys the substrates which return from the downstream side of the electronic component mounting line to the upstream side of the screen printer of interest. When a two-sided mounted substrate is taken as an object, it thereby becomes possible to perform substrate conveyance operation for returning the substrates whose first surface sides have finished undergoing mounting operation to the upstream side of the screen printer, by means of the substrate conveyance function of the electronic component mounting line itself and without use of additional conveyance means.

Further, the substrate conveyance section 8 is used as a conveyance bypass that conveys to the downstream side the substrates supplied from the upstream side of the electronic component mounting line without passing through the screen printing sections of the screen printer of interest. In a configuration where a plurality of screen printers are arranged in series, the substrates can thereby be carried into desired screen printers at required timings, and the substrates having undergone printing can also be carried out of the desired screen printers at required timings. Therefore, when compared with the related-art screen printer in which a substrate is conveyed along a single substrate conveyance path and which has a fixed substrate conveyance sequence, a degree of freedom of substrate conveyance form is significantly improved.

Moreover, as described in connection with the second and third embodiments, there is provided the substrate conveyance section 8A having the plurality of substrate conveyance lanes, whereby a plurality of different types of substrates can be subjected to printing operations performed by the screen printing sections while concurrently carried, and mixed-flow production involving simultaneous flow of different types of substrates can be addressed. Incidentally, as previously described, one of the plurality of substrate conveyance lanes is used as a return conveyance path, whereby a plurality of types of two-sided mounted substrates can efficiently be subjected to mounting operation by means of a single electronic component mounting line.

Although the present invention has been described in detail by reference to the specific embodiments, it is manifest to those who are skilled in the art that the invention is susceptible to various alterations or modifications without departing the spirit and scope of the invention.

The present patent application is based on Japanese Patent Application (JP-A-2008-095614) filed on Apr. 2, 2008 in Japan, the entire subject matter of which is incorporated herein by reference.

<Industrial Applicability>

The screen printer of the present invention yields an advantage of the capability to concurrently, efficiently subject a plurality of substrates, including different types of substrates, to printing operation; and is useful in an electronic component mounting field in which a mounted substrate is manufactured by mounting electronic components on a substrate.

The invention claimed is:

1. A screen printer system that is coupled to an upstream side of an electronic component loader which mounts electronic components on a substrate so as to constitute an electronic component mounting line, and in which two screen printers that print electronic component bonding paste to the substrate are arranged in series, wherein each of the screen printers comprises:

at least one screen printing section having a mask plate formed with a pattern hole and a squeegee moving mechanism letting a squeegee slidably move over the mask plate supplied with paste;

a substrate positioning section that is provided in the screen printing section and that positions and holds the substrate at a print position for the screen printing section; and a conveyance bypass arranged in parallel with the screen printing section and lets a substrate to be sent to a downstream machine pass through;

wherein the screen printer system comprises a substrate sorter provided between the screen printer situated on an upstream side of the sorter and the screen printer situated on a downstream side of the sorter and that sorts a substrate from the conveyance bypass situated on the upstream side to the screen printing section situated on the downstream side, or sorts a substrate from the screen printing section situated on the upstream side to the conveyance bypass situated on the downstream side;

and wherein in the substrate sorter, the substrate printed by the screen printing section situated on the upstream side is sorted to the conveyance bypass situated on the downstream side and the substrate conveyed through the conveyance bypass situated on the upstream side is sorted to the screen printing section situated on the downstream side so that printing operations subjecting a plurality of substrates including different types of substrates are concurrently carried out in the screen printing section of each of the screen printers.

2. A screen printing method in a screen printer system that is coupled to an upstream side of an electronic component loader which mounts electronic components on a substrate so as to constitute an electronic component mounting line, and in which two screen printers that print electronic component bonding paste to the substrate are arranged in series, wherein each of the screen printers comprises at least one screen printing section having a mask plate formed with a pattern hole and a squeegee moving mechanism letting a squeegee slidably move over the mask plate supplied with paste, a substrate positioning section that is provided in the screen printing section and that positions and holds the substrate at a print position for the screen printing section, and a conveyance bypass arranged in parallel with the screen printing section and lets a substrate to be sent to a downstream machine pass through, wherein the screen printer system comprises a substrate sorter provided between the screen printer situated on an upstream side of the sorter and the screen printer situated on a downstream side of the sorter and that sorts a substrate from the conveyance bypass situated on the upstream side to the screen printing section situated on the downstream side, or sorts a substrate from the screen printing section situated on the upstream side to the conveyance bypass situated on the downstream side, wherein the screen printing method comprising a step of sorting in the substrate sorter a substrate printed by the screen printing section situated on the upstream side to the conveyance bypass situated on the downstream side and sorting a substrate conveyed through the conveyance bypass situated on the upstream side to the screen printing section situated on the downstream ride so that printing operations subjecting a plurality of substrates, including different types of substrates are concurrently carried out in the screen printing section of each of the screen printers.

* * * * *